United States Patent [19]

Mouri et al.

[11] Patent Number: 5,393,638

[45] Date of Patent: Feb. 28, 1995

[54] IMAGE FORMING METHOD

[75] Inventors: Akihiro Mouri, Atsugi; Masato Katayama, Yokohama; Kazuo Isaka, Tokyo; Tetsuro Fukui, Kawasaki, all of Japan

[73] Assignee: Canon Kabushiki Kaisha, Tokyo, Japan

[21] Appl. No.: 712,556

[22] Filed: Jun. 10, 1991

[30] Foreign Application Priority Data

Jun. 12, 1990 [JP] Japan .................. 2-151726

[51] Int. Cl.$^6$ ............................. G03C 8/50
[52] U.S. Cl. ......................... 430/201; 430/254; 430/253; 430/255; 430/258; 430/138; 430/350
[58] Field of Search ............ 430/201, 203, 138, 254, 430/260, 263, 255, 253, 258, 350, 351

[56] References Cited

U.S. PATENT DOCUMENTS

| 3,245,796 | 4/1966 | Burg | 430/201 |
|---|---|---|---|
| 3,736,138 | 5/1973 | Held | 430/254 |
| 3,754,920 | 8/1973 | Kuchta | 96/87 R |
| 3,859,094 | 1/1975 | Franer et al. | 430/254 |
| 4,430,415 | 2/1984 | Aono et al. | 430/203 |
| 4,560,637 | 12/1985 | Maeda et al. | 430/203 |
| 4,599,295 | 7/1986 | Kondo et al. | 430/260 |
| 4,624,910 | 11/1986 | Takeda et al. | 430/202 |
| 4,649,098 | 3/1987 | Takeda | 430/202 |
| 4,824,756 | 4/1989 | Nakamura et al. | 430/203 |
| 5,001,032 | 3/1991 | Katayama et al. | 430/254 |
| 5,021,321 | 6/1991 | Fukui et al. | 430/201 |
| 5,064,744 | 11/1991 | Fukui et al. | 430/254 |
| 5,066,562 | 11/1991 | Nakamura | 430/351 |
| 5,171,657 | 12/1992 | Kagami et al. | 430/261 |
| 5,187,041 | 2/1993 | Mouri et al. | 430/203 |

FOREIGN PATENT DOCUMENTS

| 0254181 | 1/1988 | European Pat. Off. | 430/254 |
|---|---|---|---|
| 360014 | 3/1990 | European Pat. Off. | |
| 0362827 | 4/1990 | European Pat. Off. | 430/201 |
| 363790 | 4/1990 | European Pat. Off. | |

*Primary Examiner*—Charles L. Bowers, Jr.
*Assistant Examiner*—Martin J. Angelbranndt
*Attorney, Agent, or Firm*—Fitzpatrick, Cella, Harper & Scinto

[57] ABSTRACT

An image is formed by subjecting to imagewise exposure an image forming medium containing at least a heat-diffusible coloring matter, a photosensitive silver halide, an organic silver salt, a reducing agent, a polymerizable polymer precursor and a photopolymerization initiator; heating the image forming medium thus treated; subjecting it to polymerization exposure to form a polymerized area and an unpolymerized area in the image forming medium; separating the polymerized area from the unpolymerized area; and superposing an image receiving medium onto the unpolymerized area to transfer the heat-diffusible coloring matter in the unpolymerized area to the image receiving medium.

5 Claims, 5 Drawing Sheets

IMAGE FORMING METHOD

BACKGROUND OF THE INVENTION

1. Field of the Invention

The present invention relates to an image forming method that forms an image by dry-processing an image forming medium containing a silver halide.

2. Related Background Art

Energies used to form or record an image include light, sound, electricity, magnetism, heat, radiations such as electron rays and X-rays, and chemical energy, among which, in particular, widely used are light, electricity, heat energy, or a combination of any of these.

For example, the image forming method that employs the combination of light energy with chemical energy includes a silver salt photographic process and a method in which a diazo copying paper is used. The method that employs the combination of light energy with electric energy includes an electrophotographic system. The method that utilizes heat energy also includes a method in which a thermal recording paper or transfer recording paper is used. On the other hand, there is a method that utilizes electric energy in which an electrostatic recording paper, electrothermal recording paper, or electrosensitive recording paper is used.

Of the above image forming methods, the silver salt photographic process can obtain an image having a high resolution. The silver salt photographic process, however, requires the developing and fixing that uses complicated liquid compositions, or the drying of an image (or a print).

Now, development is energetically made on image forming methods that can form an image through a simple processing.

For example, U.S. Pat. No. 4,629,676 teaches a method in which polymerization reaction under dry (thermal) conditions is caused by the photosensitive reaction of silver halide that acts as a trigger, to form an image comprising a polymer.

This method has the advantage that no complicated wet processing is not required, but has had the disadvantage that the polymer formation rate (i.e., polymerization rate of a polymeric compound) is so low that it takes a long time to form the polymer image. Incidentally, this disadvantage arises presumably because of a reaction intermediate (which functions as a polymerization initiator) formed in the course of heating, by the reaction between silver produced from silver halide by imagewise exposure and a reducing agent, which intermediate is so stable and has so low activity as the polymerization initiator that the polymerization reaction can not proceed so rapidly.

On the other hand, to cope with this problem to accelerate the polymerization, Japanese Patent Application Laid-open No. 52-70836 discloses a method in which a thermal polymerization initiator is used.

This method comprises forming a latent image comprising silver metal produced from silver halide by imagewise exposure, converting, under heating, a reducing agent into an oxidized product having a polymerization inhibitory powder different from that of said reducing agent by utilizing a catalytic action of the above silver metal, thereby producing a difference in the polymerization inhibitory power between the reducing agent and the resulting oxidized product and also causing a thermal polymerization reaction utilizing the thermal polymerization initiator, thus forming a polymer image corresponding to the difference in the polymerization inhibitory power.

This method, however, has the disadvantage that a good contrast can only be made with difficulty in the polymer image.

This disadvantage arises presumably because the oxidation-reduction reaction taking place in a latent image portion to form the oxidized product and the polymerization reaction to form the polymer image are allowed to take place in the same heating step, so that these reactions may proceed in a competitive fashion and thus the respective reactions may not proceed in a good efficiency.

The image formation according to this method is very unstable in that, for example, the areas on which the polymer is formed may turn into exposed areas or unexposed areas only because of a slight change in the amount of the reducing agent.

U.S. Pat. No. 4,649,098 also discloses a method in which a reducing agent having a polymerization inhibitory power is formed into an oxidized product by imagewise consumption (at imagewise exposed areas) in the course of the developing of silver halide, and, after imagewise inhibition (at imagewise unexposed areas) of polymerization reaction by the action of the residual reducing agent, light energy is uniformly applied (whole areal exposure) from the outside to cause photopolymerization at the area at which the reducing agent has been consumed (imagewise exposed area), thus forming a polymer image.

Our research group has proposed a method in which an image comprised of a coloring matter is formed on an image receiving paper by utilizing a difference in the rate of evaporation of coloring matters between a polymerized area and an unpolymerized area (U.S. Ser. No. 564,060 filed on Aug. 8, 1990 corresponding to Japanese Patent Application No. 1-205626).

When a multi-color image is formed utilizing the difference in the rate of evaporation of coloring matters between a polymerized area and an unpolymerized area, plural images with different colors must be formed superposingly on the same sheet of image receiving paper. It, however, has been technically very difficult to superpose plural images with different colors in a doubling-free (or misregistration-free) state.

To overcome the above problem, our research group has proposed an image forming method that can superpose images in a doubling-free state when plural images with different colors are formed superposingly on the same image receiving medium, and an image forming apparatus for carrying out such a method (U.S. Ser. No. 679,903 filed on Apr. 3, 1991 corresponding to Japanese Patent Application No. 2-88168).

SUMMARY OF THE INVENTION

The present invention is a further improvement of the method of forming an image by utilizing the difference in the rate of evaporation of coloring matters between a polymerized area and an unpolymerized area. An object of the present invention is to provide an image forming method that never allows coloring matters to transfer to the area on an image receiving medium where none of coloring matters must be transferred.

The image forming method of the present invention is characterized by having a process comprising the steps of;

(a) subjecting to imagewise exposure an image forming medium containing at least a heat-diffusible coloring matter, a photosensitive silver halide, an organic silver salt, a reducing agent, a polymerizable polymer precursor and a photopolymerization initiator;

(b) heating the image forming medium having been subjected to the step (a);

(c) subjecting the image forming medium having been subjected to the step (b), to polymerization exposure to form a polymerized area and an unpolymerized area in the image forming medium;

(d) separating said polymerized area from said unpolymerized area; and (e) superposing an image receiving medium onto said unpolymerized area to transfer said heat-diffusible coloring matter in said unpolymerized area to said image receiving medium.

The image forming method of the present invention is also characterized by having a process comprising the steps of;

(a) subjecting to imagewise exposure a first medium containing at least a photosensitive silver halide, an organic silver salt and a reducing agent;

(b) heating the first medium having been subjected to the step (a);

(c) superposing a second medium containing at least a heat-diffusible coloring matter, a polymerizable polymer precursor and a photopolymerization initiator, onto said first medium, and in that state subjecting said second medium to polymerization exposure through said first medium to form a polymerized area and an unpolymerized area in said second medium;

(d) separating said polymerized area from said unpolymerized area; and (e) superposing an image receiving medium onto said unpolymerized area to transfer said heat-diffusible coloring matter in said unpolymerized area to said image receiving medium.

The image forming method of the present invention is still also characterized by having a process comprising the steps of;

(a) superposing onto an image receiving medium an image forming medium containing at least a heat-diffusible coloring matter, a photosensitive silver halide, an organic silver salt, a reducing agent, a polymerizable polymer precursor and a photopolymerization initiator, and in that state subjecting said image forming medium to imagewise exposure;

(b) heating the image forming medium having been subjected to the step (a);

(c) subjecting the image forming medium having been subjected to the step (b), to polymerization exposure to form a polymerized area and an unpolymerized area in the image forming medium;

(d) separating said polymerized area from said unpolymerized area to give a state in which said unpolymerized area is arranged on said image receiving medium;

(e) transferring said heat-diffusible coloring matter in said unpolymerized area to said image receiving medium; and (f) removing said unpolymerized area arranged on said image receiving medium.

DESCRIPTION OF THE PREFERRED EMBODIMENTS

Preferred embodiments of the present invention will be described below with reference to the accompanying drawings.

Figure 1A:
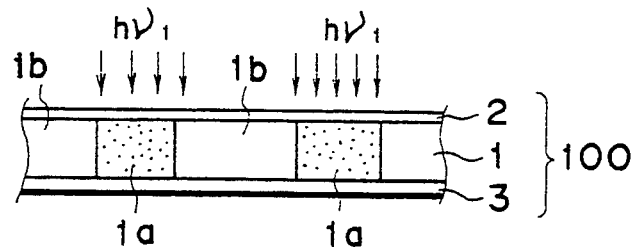
FIGS. 1A to 1E partially illustrate for each step an example of a process in the image forming method of the present invention.

In the image forming method of the present invention, an image is formed by a process comprising the following steps:

(a) As shown in FIG. 1A, an image forming medium 100 comprising a substrate 3 and formed thereon an image forming layer 1 and a protective layer 2 in this order is imagewise exposed to light in the desired form from the side of, for example, the protective layer 2.

The image forming layer 1 contains at least a heat-diffusible coloring matter, a photosensitive silver halide, an organic silver salt, a reducing agent, a polymerizable polymer precursor and a photopolymerization initiator. In the image forming medium 100, the organic silver salt and reducing agent contained in the image forming layer 1 undergo oxidation-reduction reaction as a result of subjecting the image forming layer 1 to exposure and heating (heat development), and the oxidized product produced as a result of the reaction serves as a light-absorbing compound. Alternatively, the oxidized product produced as a result of the reaction between the organic silver salt and reducing agent further reacts with a coupler to produce the light-absorbing compound. The imagewise exposure is carried out using, for example, a laser beam $h\nu_1$ that scans corresponding with image signals. As a result of the imagewise exposure, silver metal is produced from the photosensitive silver halide present in an exposed area 1a, and this forms a latent image. The silver metal serves as a catalyst of the thermal reaction between the organic silver salt and reducing agent.

As conditions for the exposure to light in carrying out the writing of this latent image, conditions under which the resulting polymer image can obtain the desired performance such as sufficient contrast may be used by appropriately selecting them depending on the concentration, type and so forth of the photosensitive silver halide incorporated into the image forming medium.

The image forming method of the present invention, which employs the photosensitive silver halide in the step of this imagewise exposure, enables highly sensitive writing.

The protective layer 2 plays a role to prevent the polymerization reaction from being inhibited by oxygen and also prevent any damages ascribable to an external force. As will be detailed later, it may preferably be made of a material different from that of the substrate 3 provided opposingly thereto.

Figure 1B:
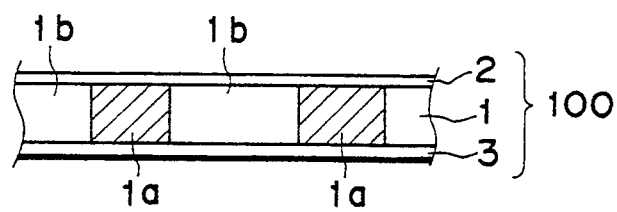

(b) Next, the image forming medium 100 in which the latent image has been formed is heated (i.e., thermally developed) as shown in FIG. 1B. As a result of heating the image forming layer 1, the silver metal selectively acts as a catalyst in the exposed area 1a, where the organic silver salt reacts with the reducing agent. The organic silver salt is reduced to a silver atom (metallic silver) and at the same time the reducing agent is oxidized to form an oxidized product. This oxidized product has light absorption. In another instance, the oxidized product further reacts with a coupler to produce an organic compound that exhibits light absorption.

As a heating means, it is possible to utilize, for example, a method in which a heating belt, a hot plate, a heat roll, a thermal head or the like is used, or a method in which heating is carried out by electrification, irradiation with laser beams, irradiation with microwaves or irradiation with infrared rays.

The heating is carried out under appropriate selection of conditions necessary for the progress of oxidation-reduction reaction and the formation of the light-absorbing organic compound. The heating temperature depends on the composition of mediums and can not be sweepingly defined. The heating may preferably be carried out at a temperature of from 60° C. to 200° C., and more preferably from 70° C. to 150° C., for 1 second to 5 minutes, and more preferably for 3 seconds to 60 seconds. In general, high temperatures can complete the heating in a short time and low temperatures may require the heating to be carried out for a long time.

Figure 1C:
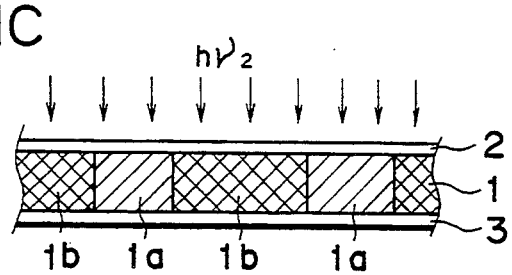
Figure 1D:
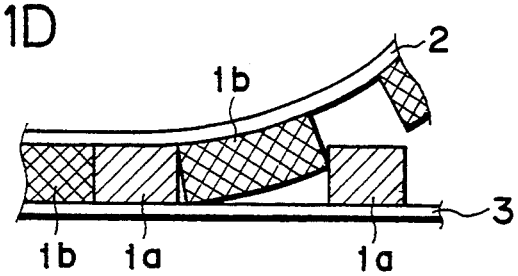
Figure 1E:
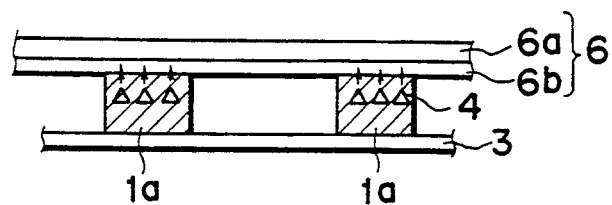

(c) Subsequently, as shown in FIG. 1C, the image forming layer 1 is subjected to polymerization exposure ($h\nu_2$). As a result of the polymerization exposure on the whole surface of the image forming layer 1, the polymerizable polymer precursor is polymerized in an imagewise unexposed area 1b by the action of the photopolymerization initiator. On the other hand, the light-absorbing compound is present at the imagewise exposed area 1a, and therefore the light with wavelengths for the polymerization exposure is absorbed into that area, so that no polymerization proceeds there, compared with the imagewise unexposed area 1b. Hence, a difference in the state of polymer formation occurs between the imagewise exposed area 1a and the imagewise unexposed area 1b, so that a polymer image is formed in the imagewise unexposed area 1b.

In the step of (c), the light used in subjecting the image forming layer 1 to the whole areal exposure is the light with wavelengths to which the photopolymerization initiator (in the present invention, photopolymerization initiator is defined to include a sensitizer) has a sensitivity and also which the light-absorbing compound can absorb (i.e., light with effective wavelengths).

However, light with wavelengths other than the light with effective wavelengths may also be used in combination within the purport that the desired polymer image can be obtained. In instances in which the wavelength regions must be limited, the exposure may be carried out using, for example, a cut filter.

In the present invention, the unpolymerized area refers to not only the area in which no polymerization has taken place at all but also the area in which the polymerization has relatively not proceeded.

In the step (c), a means for heating the image forming medium may also be used at the same time with the polymerization exposure. This may be carried out using an additional heating means, or may be carried out utilizing residual heat in the step (b).

(d) After the unpolymerized area corresponding to the imagewise exposed area 1a and the polymerized area corresponding to the imagewise unexposed area 1b have been formed in the image forming layer 1, the protective layer 2 is pulled apart from the substrate 3, so that the unpolymerized area 1a remains on the substrate 3 and the polymerized area 1b remains on the protective layer 2 (i.e., peel-apart). Namely, the unpolymerized area 1a and the polymerized area 1b are separated in the step (d). This phenomenon occurs because the adhesive force of the image forming layer 1 to the substrate 3 and that to the protective layer 2 differ between the unpolymerized area 1a and the polymerized area 1b. In order for the unpolymerized area 1a and polymerized area 1b to be surely separated from each other, it is required for the protective layer 2 and the substrate 3 not to have the same surface composition.

For example, the protective layer 2 may be comprised of a material selected from various kinds of plastic films made of polyethylene terephthalate (PET), polypropylene, polyethylene, cellophane, polyimide, 6,6-nylon or polystyrene; resins such as polyvinyl alcohol (PVA) and polybutyral; and metals such as Al transparent to light, as exemplified by those formed in a thin layer by vacuum deposition on any of the above plastic films or resins. The substrate 3 may be comprised of a material selected from resins such as polyester, polycarbonate, polyvinyl acetate, polycaprolactone and polyvinyl chloride. Thus the polymerized area 1b can remain on the protective layer 2, and the unpolymerized area 1a on the substrate 3. In particular, the protective layer 2 may preferably be comprised of PVA, polyimide or PET, and the substrate 3 may preferably be comprised of polyester. In the case when PVA is used in the protective layer 2, PET can be used in the substrate 3.

When taking note only of the process of forming an image by separation of a polymer image (i.e., adhesion transfer) as in this step (d), such a process is disclosed in, for example, Japanese Patent Publication No. 38-9663 and Japanese Patent Application Laid-Open No. 49-32640. The method of the present invention can be said to be superior to the method disclosed in those publications, in terms of sensitivity to light, light-sensitive wavelength regions, process speed, capability of image processing, and a good color image obtainable.

(e) An image receiving layer 6b formed on a substrate 6a of an image receiving medium 6 is superposed on the unpolymerized area 1a remaining on the substrate 3, followed by heating to an appropriate degree. As a result, a heat-diffusible coloring matter 4 contained in the unpolymerized area 1a is thermally diffused and transferred to the image receiving layer 6b, and thus an image comprised of the heat-diffusible coloring matter 4 is formed on the image receiving medium 6.

With regard to the heating condition in the step (e), its desirable value may vary depending on the kind of the heat-diffusible coloring matter and other various conditions. It should be in the range of from 80° C. to 250° C., and preferably from 80° C. to 200° C. As heating means, it is possible to use the same heating means as described in relation to the step (c) (the step of heat development).

The image receiving layer 6b of the image receiving medium 6 used in the step (e) may be made of a material capable of achieving a good diffusion transfer of the heat-diffusible coloring matter and forming the desired image. For example, it is possible to use polyester resins, polycarbonate resins, polyvinyl acetate resins, polycaprolactam resins and polyvinyl chloride resins. As the substrate 6a, it is possible to use, for example, paper or PET. In instances in which a sufficient strength can be maintained only with the image receiving layer 6b, the substrate 6a need not be provided.

In the foregoing, an example has been described in which two kinds of areas, the exposed area and the unexposed area are formed in the step (a). The present invention is by no means limited to such an example. For example, when in the step (a) the imagewise exposure is carried out through a filter having a density gradation, and in the step (c) the unpolymerized area is thereby made gradational, the diffusibility of the heat-diffusible coloring matter is position-selectively inhibited, so that a highly gradational color image can be readily obtained.

A monochromatic image is thus formed on the image receiving medium.

In the case when a multi-color image is formed, the above steps (a) to (e) are repeated further after completion of the step (e) except that the image forming medium is replaced with an image forming medium containing a heat-diffusible coloring matter with a different color. The process from step (a) to step (e) may be thus repeated in the number of times corresponding to the number of the additional desired colors so that images with the respective colors are superposed on the same image receiving medium 6. Thus a multi-color image can be formed. For example, in an instance in which images with colors of yellow, magenta, cyan and black are superposed on the same image receiving medium 6 to form a multi-color image, the image formation according to the process from step (a) to step (e) may be carried out four times.

As light sources used in the imagewise exposure and the polymerization exposure, usable are, for example, sunlight, tungsten lamps, mercury lamps, halogen lamps, xenon lamps, fluorescent lamps, LEDs, and lasers, and the wavelength of the light used in these steps may be the same or different. Even if the light having the same wavelength is used, the latent image can be sufficiently written with use of light having an intensity of the level that may not cause photopolymerization in the step of imagewise exposure, since the photosensitive silver halide usually has a sufficiently higher photosensitivity than the photopolymerization initiator. For example, in the step of imagewise exposure, the exposure may be carried out using light that may give about 1 mJ/cm$^2$ or less at the surface of the image forming medium. In the step of polymerization exposure, the exposure may be carried out using light that may give about 500 mJ/cm$^2$ or less at the surface of the image forming medium.

Figure 2A:
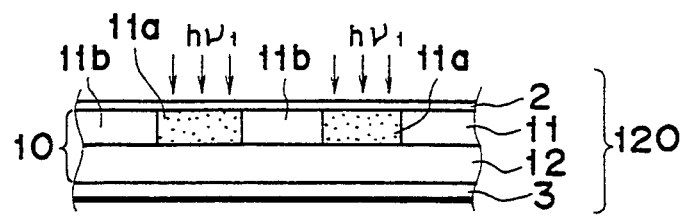
FIGS. 2A to 2E partially illustrate for each step another example of a process in the image forming method of the present invention.

The image forming layer 1 may be of multi-layer structure. For example, as shown in FIG. 2A, an image forming medium 120 may be used, comprising an image forming layer 10 comprised of a photosensitive layer 11 and a polymerizing layer 12. In this instance, the photosensitive layer 11 contains at least the photosensitive silver halide, organic silver salt and reducing agent, and the polymerizing layer 12 contains at least the heat-diffusible coloring matter, the polymerizable polymer precursor and photopolymerization initiator.

In instances in which an image is formed using the image forming medium comprised of the image forming layer of multi-layer structure, the image is formed according to the same image forming method as described in relation to FIG. 1. First, as shown in FIG. 2A, the photosensitive layer 11 is imagewise exposed to light (hv$_1$) in the desired form. As a result, silver metal is produced on the photosensitive silver halide in an exposed area 11a. This forms a latent image. The silver metal produced serves as a catalyst for the thermal reaction between the organic silver salt and reducing agent contained in the photosensitive layer 11.

Figure 2B:
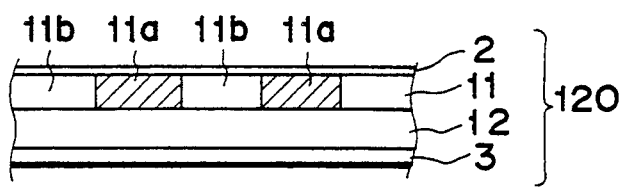

Next, as shown in FIG. 2B, in step (b) the photosensitive layer 11 in which the latent image has been formed is heated. As a result, the silver metal selectively acts as a catalyst at the exposed area 11a, and the organic silver salt reacts with the reducing agent, where the organic silver salt is reduced to a silver atom and at the same time the reducing agent is formed into an oxidized product.

Heating conditions in this step of heat development are the same as the instance described in relation to FIG. 1.

Figure 2C:
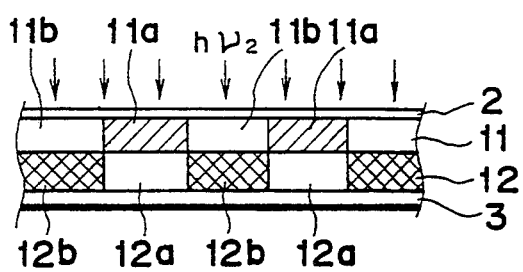

Subsequently, as shown in FIG. 2C, in step (c), polymerization exposure is carried out on the whole surface (hv$_2$) from the photosensitive layer 11 side to bring the photopolymerization initiator contained in the polymerizing layer 12 into cleavage to generate a radical species. This radical species causes polymerization reaction, and thus a polymer area is formed in the polymerizing layer 12. On that occasion, the amount of transmission of the light of the wavelength region which the photopolymerization initiator absorbs is different between the exposed area 11a and unexposed area 11b, and hence a difference is produced in the state of formation of polymers, between the part 12a corresponding to the exposed area 11a and the part 12b corresponding to the unexposed area 11b, of the polymerizing layer 12 (resulting in a higher degree of polymerization at the part 12b corresponding to the unexposed area 11b than the part corresponding to the exposed area 11a). A polymer image is thus formed because of this difference.

Figure 2D:
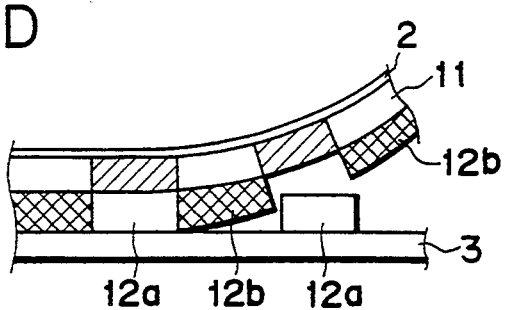

As shown in FIG. 2D, in step (d) the protective layer 2 is separated from the substrate 3, so that the unpolymerized area 12a remains on the substrate 3 and the photosensitive layer 11 and the polymerized area 12b remains on the protective layer 2. In this instance also, like the case of the method described with reference to FIG. 1, it is preferred to use, for example, PVA, polyimide or the like in the protective layer 2 and polyester or the like in the substrate 3.

Figure 2E:
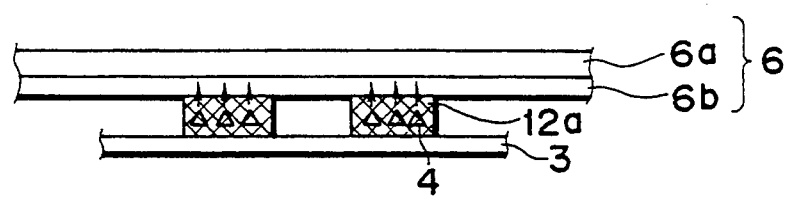

As shown in FIG. 2E, in step (e) an image receiving medium 6 is superposed onto the unpolymerized area 12a remaining on the substrate 3, followed by heating so that the heat-diffusible coloring matter can be transferred to the image receiving medium 6. The process from step (a) to step (e) may be thus repeated in the number of times corresponding to the number of the additional desired colors. Thus a multi-color image can be formed on the image receiving medium 6.

Figure 5:
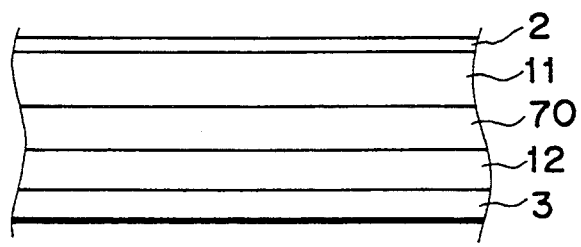
FIG. 5 partially illustrates an example of an image forming medium used in the image forming method of the present invention.

In the step (d), as shown in FIG. 5, an intermediate layer 70 may be provided between the protective layer 2 and the polymerizing layer 12 so that the unpolymerized area 12a and the polymerized area 12b can be more surely separated. As materials for the intermediate layer 70, the same ones as exemplified for those of the protective layer 2 can be used.

The image forming medium shown in FIG. 2A may be divided into a fist medium having the protective layer 2 and the photosensitive layer 11 and a second medium having the substrate 3 and the polymerizing layer 12. More specifically, the photosensitive layer 11 may be first subjected to imagewise exposure in the step (a) and heat development in the step (b), respectively, and after completion of the steps (a) and (b) the photosensitive layer 11 may be superposed onto the polymerizing layer 12 to follow the respective steps (c), (d) and (e) as described with reference to FIGS. 2A to 2E. Alternatively, after completion of the step (a), the photosensitive layer 11 may be superposed onto the polymerizing layer 12 to thereafter follow the respective steps (b), (c), (d) and (e) as described with reference to FIGS. 2A to 2E.

The image may also be formed as shown in FIGS. 3A to 3F and FIGS. 4A to 4F, using an image forming medium 130 (FIG. 3A) and an image forming medium 140 (FIG. 4A), respectively, which correspond to mediums wherein the substrate 3 has been removed from the image forming mediums shown in FIG. 1A and FIG. 2A, respectively.

More specifically, the former will be described below with reference to FIGS. 3A to 3F.

Figure 3A:
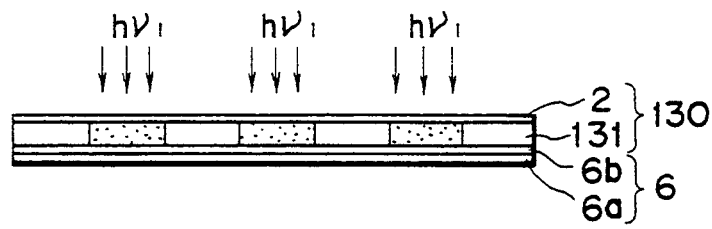
FIGS. 3A to 3F partially illustrate for each step still another example of a process in the image forming method of the present invention.

(a) As shown in FIG. 3A, an image forming layer 131 of the image forming medium 130 is superposed onto an image receiving medium 6, and the image forming layer 131 is subjected to imagewise exposure (hv$_1$). The image forming layer 131 is the same as the image forming layer 1 shown in FIG. 1A. Thus, silver metal is produced from the photosensitive silver halide present in an exposed area 131, and this forms a latent image.

Figure 3B:
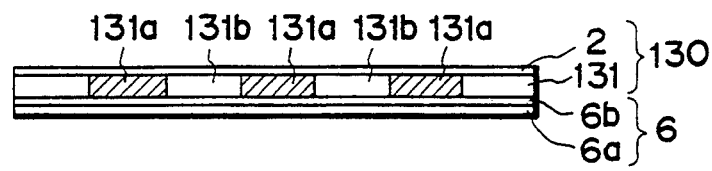

(b) Next, the image forming medium 130 in which the latent image has been formed is heated (i.e., thermally developed) as shown in FIG. 3B. As a result, the organic silver salt is reduced to a silver atom (metallic silver) and at the same time the reducing agent is oxidized to form an oxidized product having light absorption. In another instance, the oxidized product further reacts with a coupler to produce an organic compound that exhibits light absorption.

Figure 3C:
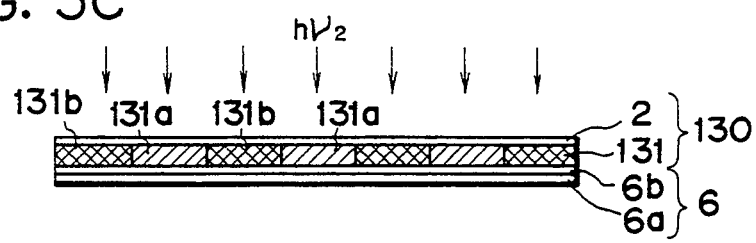
Figure 3D:
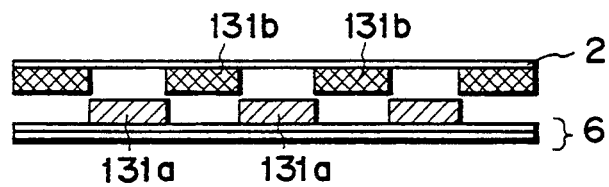
Figure 3E:
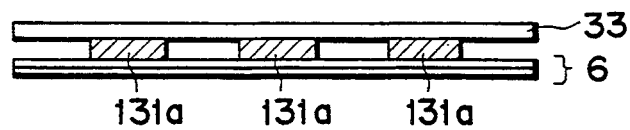
Figure 3F:
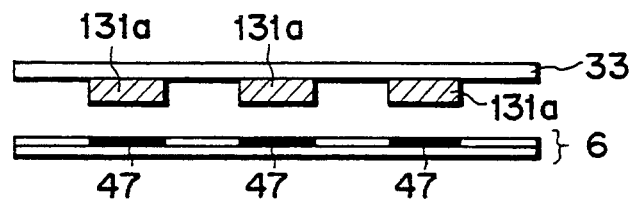

(c) Subsequently, as shown in FIG. 3C, the image forming layer 131 is subjected to polymerization exposure (hv$_2$). As a result, an imagewise unexposed area 131b is polymerized to form a polymerized area, and the imagewise exposed area 131a remains unpolymerized.

(d) The protective layer 2 is separated from the image receiving medium 6, so that the unpolymerized area 131a remains on the image receiving medium 6 and the polymerized area 131b remains on the protective layer 2. Here, an image receiving layer 6b of the image receiving medium 6 is formed of the same material such as polyester, as used in the substrate 3.

(e) The unpolymerized area 131a remaining on the image receiving medium 6 is heated so that the heat-diffusible coloring matter is transferred onto the image receiving medium 6 to form an image. On the occasion of heating, it is preferred to carry out heating in the state that a protective sheet 33 is overlaid on the unpolymerized area 131a. The protective sheet 33 may be comprised of, for example, PET, polyimide or the like.

(f) As a final step, the unpolymerized area 131a is removed from the image receiving medium 6. The unpolymerized area 131a may be removed preferably by adhering the unpolymerized area 131a to the protective sheet 33 and then peeling the protective sheet 33 from the image receiving medium 6.

The unpolymerized area 131a has come to be readily adhered to the protective sheet 33 as a result of the heating in the step (e). In order to definitely remove the unpolymerized area 131a, an adhesive layer may also be provided on the surface of the protective sheet 33.

An image 47 is thus formed on the image receiving medium 6. When a multi-color image is formed, like the case described with reference to FIGS. 1A to 1E, the image forming medium is replaced with an image forming medium containing a heat-diffusible coloring matter of a different color, after completion of the step (f), and the respective steps shown in FIGS. 3A to 3F are repeated necessary times.

Figure 4A:
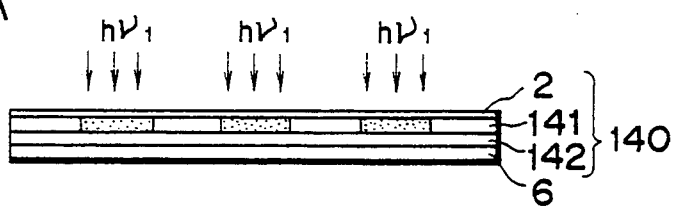
FIGS. 4A to 4F partially illustrate for each step still another example of a process in the image forming method of the present invention.

The same procedure as in the image forming method described with reference to FIGS. 3A to 3F is taken also when an image is formed using the image forming medium 140 shown in FIG. 4A. First, as shown in FIG. 4A, an image forming layer 1 (comprising a lamination of a photosensitive layer 141 and a polymerizing layer 142) of the image forming medium 140 is superposed onto an image receiving medium 6, and the photosensitive layer 141 is subjected to imagewise exposure (hv$_1$) in the desired form. The image forming layer of the image forming medium 140 is the same as the image forming layer 1 of the image forming medium 120 shown in FIG. 2A. Thus, silver metal is produced from the photosensitive silver halide present in an exposed area 141a, and this forms a latent image.

Figure 4B:
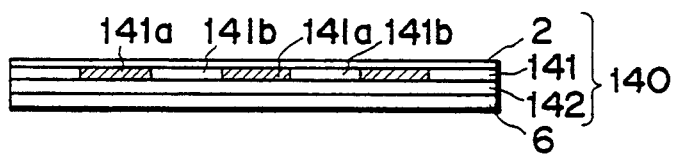

Next, in step (b) the photosensitive layer 141 in which the latent image has been formed is heated as shown in FIG. 4B. As a result, the silver metal selectively acts as a catalyst in the exposed area 141a, where the organic silver salt reacts with the reducing agent. The organic silver salt is reduced to a silver atom and at the same time the reducing agent is formed into an oxidized product.

Figure 4C:
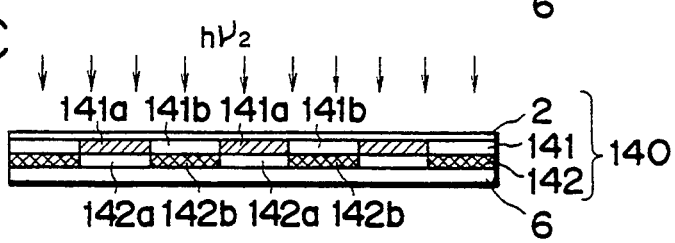

Subsequently, as shown in FIG. 4C, in step (c) polymerization exposure (hv$_2$) is carried out from the photosensitive layer 141 side. As a result, the part 142b corresponding to an imagewise unexposed area 141b of the polymerizing layer 12 is polymerized to form a polymerized area, and the part 142a corresponding to an imagewise exposed area 141a remains unpolymerized.

Figure 4D:
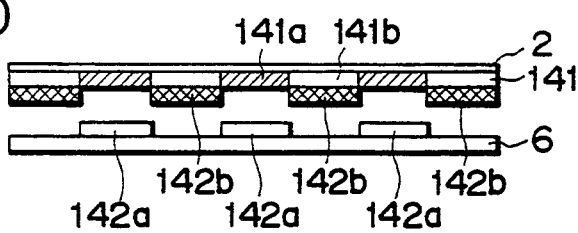
Figure 4E:
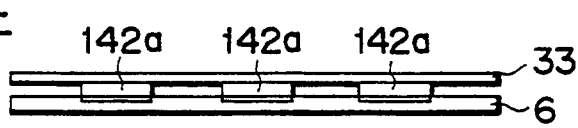
Figure 4F:
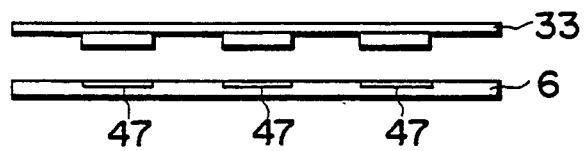

Then, as shown in FIG. 4D, in step (d) the protective layer 2 is separated from the image receiving medium 6, so that the unpolymerized area 142a remains on the image receiving medium 6 and the photosensitive layer 141 and polymerized area 142b remain on the protective layer 2.

In step (e) (FIG. 4E), the unpolymerized area 142a remaining on the image receiving medium 6 is heated, and in step (f) (FIG. 4F), as a final step, removed from the image receiving medium 6.

An image 47 is thus formed on the image receiving medium 6. When a multi-color image is formed, like the case described with reference to FIGS. 2A to 2E, the image forming medium is replaced with an image forming medium containing a heat-diffusible coloring matter of a different color, after completion of the step (f), and the respective steps shown in FIGS. 4A to 4F are repeated.

In the image forming medium 140 shown in FIGS. 4A to 4F, the same layer as the intermediate layer 70 shown in FIG. 5 may also be provided between the photosensitive layer 141 and the polymerizing layer 142.

Now, when a plurality of images with different colors are overlaid on the same image receiving medium to form the multi-color image, it is very difficult to superpose the plural images with different colors in a doubling-free (misregistration-free) state with one another. However, the method as described with reference to FIGS. 3A to 3F or FIGS. 4A to 4F makes it possible to superpose the plural images on the same image receiving medium in a doubling-free state with one another.

An image forming method by which plural images with different colors can be superposed in a doubling-free state one to another even when the images are formed overlapping on the same image receiving medium will be described below.

Figure 6:
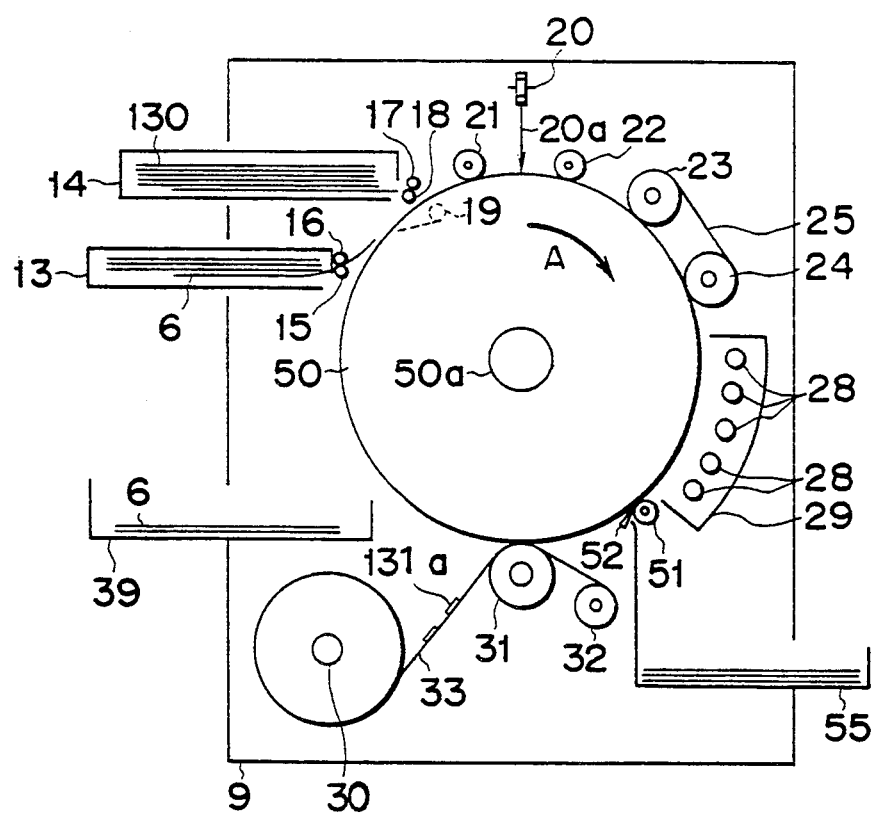
FIG. 6 schematically illustrates an example of an apparatus that carries out the image forming method of the present invention.

An image forming apparatus that carries out such a color image forming method of the present invention comprises, as shown in FIG. 6, an outer case 9, in the interior of which the cylindrical support member 50 is rotatably provided around the rotating shaft 50a.

A feed zone of this apparatus is detachably provided with a cartridge 14 in which the image forming medium 130 or 140 is contained and a cartridge 13 in which the image receiving medium 6 is contained.

The image receiving medium 6 fed from the cartridge 13 by means of rollers 15 and 16 is chucked with a clip 19 provided on the periphery of the support member 50 and secured at a given position on the periphery of the support member 50 as the support member 50 is rotated in the direction of the arrow A. On the other hand, the image forming medium 130 fed from the cartridge 14 by means of rollers 17 and 18 is superposed on the image receiving medium 6 and delivered to an imagewise exposure zone as the support member 50 is rotated. The clip 19 is provided in a recess made in the peripheral wall of the support member 50.

At the imagewise exposure zone, the image forming medium 130 on the image receiving medium 6 is imagewise exposed by means of a first exposure means 20 such as a laser. The exposure means 20 is scanned according to image signals. Supporting rollers 21 and 22 bring the image receiving medium 6 and the image forming medium 130 into close contact with the periphery of the support member 2.

The image forming medium 130 having been imagewise exposed is forwarded to a heat development zone as the support member 50 is rotated and heated with heating rollers 23 and 24 and a belt 25 that constitute a first heating means.

The image forming medium 130 thus developed is forwarded to a polymerization exposure zone as the support member 50 is rotated. The polymerization exposure zone is provided with light sources 28 comprised of ultraviolet fluorescent lamps and a light-source guide 29 that constitute a second exposure means, where the image forming layer 131 is exposed to ultraviolet light to form an unpolymerized area and a polymerized area in the image forming layer 131.

The image receiving medium 6 and image forming medium 130, having been processed at the polymerization exposure zone, are then delivered to a separation zone as the support member 50 is rotated, where the unpolymerized area 131a and the polymerized area 131b are separated from each other.

More specifically, the protective layer 2 of the image forming medium 130 and the polymerized area 131b are peeled from the image receiving medium 6 and unpolymerized area 131a by means of a peel roller 51 and a blade 52, and outputted to a tray 55. On the other hand, the image receiving medium 6 and the unpolymerized area 131a of the image forming medium 130 remain fixed to the periphery of the support member 50 and transported to a transfer zone.

At the transfer zone, the unpolymerized area 131a is superposed on a protective sheet 33 fed from a roller 32, and is then heated with a heating roller 31 that serves as a second heating means, so that the heat-diffusible coloring matter in the unpolymerized area 131a is transferred to the image receiving medium 6 and thus an image is formed on the image receiving medium 6. Subsequently, the unpolymerized area 131a, which is in adhesion to the protective sheet 33, is peeled from the image receiving medium 6 and wound up around a wind-up roller 30 together with the protective sheet 33.

The image receiving medium 6 on which an image has been formed at the transfer zone is delivered to an output zone as the support member 50 is rotated and thus outputted to an image receiving medium output tray 39 as a result of the release of the clip 19 of the support member 50.

In the case when images with other colors are further superposingly formed on the image receiving medium 6 on which an image has been formed at the transfer zone, the image receiving medium 6 with the image is delivered, without its output at the output zone, to the feed zone as the support member 50 is rotated. On the image receiving medium 6 delivered to the feed zone, an image forming medium containing a heat-diffusible coloring matter with a different color is again superposed here, and then successively delivered to the imagewise exposure zone, heat development zone, polymerization exposure zone, separation zone and transfer zone, so that an image is again formed.

The transport through the feed zone, imagewise exposure zone, heat development zone, polymerization exposure zone, separation zone and transfer zone is repeated in this way, so that a multi-color image can be formed on the image receiving medium 6, and the resulting image receiving medium 6 is finally outputted to the output tray 39.

In this way, after the image receiving medium 6 has been secured to the support member 50, the image forming medium 130 or 140 is superposed on the image receiving medium 6 and, in that state, the imagewise exposure is carried out. Thus, the images with colors can be formed in a doubling-free state even when images with different colors are superposingly formed on the image receiving medium 6.

Examples of the image forming medium that can be used in the image forming method of the present invention will be described below in detail.

The image forming medium used in the present invention contains at least i) a photosensitive silver halide, an organic silver salt and a reducing agent that react each other to produce a light-absorbing compound as a result of imagewise exposure and heating, ii) a polymerizable polymer precursor, iii) a photopolymerization initiator, and iv) a heat-diffusible coloring matter; said light-absorbing compound being capable of absorbing light with wavelengths to which said photopolymerization initiator has a sensitivity.

The photosensitive silver halide used in the image forming medium may include silver chloride, silver bromide, silver chlorobromide, silver iodobromide, and silver chloroiodobromide. These may have been subjected to chemical sensitization and optical sensitization as done in respect of usual photographic emulsions. More specifically, the chemical sensitization that can be used includes sulfur sensitization, noble metal sensitization, and reduction sensitization. The optical sensitization that can be applied includes methods using conventionally known sensitizing coloring matters.

The sensitizing coloring matters that may be preferably used include cyanine coloring matters, merocyanine coloring matters, and trinuclear coloring matters, as exemplified by 3,3'-dicarboxyethyl-2,2'-thiacarbocyanine iodide, 3,3'-diethyl-2,2'-thiacarbocyanine iodide, 3,3'-disulfoethyl-2,2'-thiadicarbocyanine bromide, 3,3'-diethyl-2,2'-thiatricarbocyanine iodide, and further the coloring matters having the following structural formula:

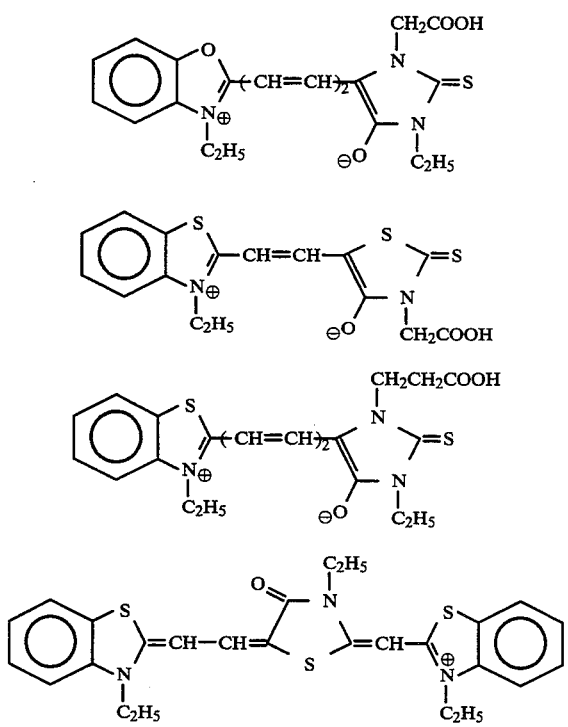

The halogen composition in a grain may be uniform, or the grain may have a multi-layer structure with different composition. It is also possible to use two or more kinds of silver halides having different halogen composition, grain size, grain size distribution, etc.

The organic silver salt that can be used in the image forming medium includes organic acid silver salts or triazole silver salts as described in SHASHIN KOGAKU NO KISO (Basic Photographic Engineering), First Edition, published 1982, The Non-silver Salt Volume, p.247, or Japanese Patent Application Laid-open No. 59-55429. It is preferred to use silver salts having a low photosensitivity. They include, for example, silver salts of aliphatic carboxylic acids, aromatic carboxylic acids, thiocarbonyl compounds having a mercapto group or α-hydrogen, and imino group-containing compounds.

The aliphatic carboxylic acids include acetic acid, butyric acid, succinic acid, sebacic acid, adipic acid, oleic acid, linoleic acid, linolenic acid, tartaric acid, palmitic acid, Stearic acid, behenic acid and camphor acid. In general, however, silver salts are not stabler as they have a smaller number of carbon atoms, and hence those having an appropriate number of carbon atoms (as exemplified by those having 16 to 26 carbon atoms) are preferred.

The aromatic carboxylic acids include benzoic acid derivatives, quinolinic acid derivatives, naphthalene carboxylic acid derivatives, salicylic acid derivatives, gallic acid, tannic acid, phthalic acid, phenyl acetic acid derivatives, and pyromellitic acid.

The compounds having a mercapto or thiocarbonyl group include 3-mercapto-4-phenyl-1,2,4-triazole, 2-mercaptobenzoimidazole, 2-mercapto-5-aminothiadiazole, 2-mercaptobenzothiazole, s-alkylthioglycolic acid (alkyl group carbon atom number of 12 to 23), dithiocarboxylic acids such as dithioacetic acid, thioamides such as thiostearoamide, and mercapto compounds such as 5-carboxy-1-methyl-2-phenyl-4-thiopyridine, mercaptotriazine, 2-mercaptobenzoxazole, mercaptooxadiazole, and 3-amino-5-benzylthio-1,2,4-triazole, which are described in U.S. Pat. No. 4,123,274.

The compounds having an imino group typically include benzotriazole or derivatives thereof, described in Japanese Patent Publication No. 44-30270 or No. 45-18416, as exemplified by benzotriazole and alkyl-substituted benzotriazoles such as methylbenzotriazole, halogen-substituted benzotriazoles such as 5-chlorobenzotriazole, carboimidobenzotriazoles such as butylcarboimidobenzotriazole, nitrobenzotriazoles, described in Japanese Patent Application Laid-open No. 58-118639, sulfobenzotriazole, carboxybenzotriazole or salts thereof, or hydroxybenzotriazole, described in Japanese Patent Application Laid-open No. 58-115638, 1,2,4-triazole, described in U.S. Pat. No. 4,220,709, or 1H-tetrazole, carbazole, saccharin, imidazole, and derivatives thereof.

The reducing agent that turns into the light-absorbing compound as a result of oxidation-reduction reaction includes, for example, the compound represented by the following Formula (I):

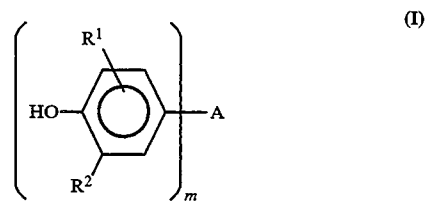

In the above Formula (I), R1 and R2 each independently represent a hydrogen atom, a hydroxyl group, a halogen atom, a substituted or unsubstituted alkyl group, a substituted or unsubstituted alkenyl group, a substituted or unsubstituted alkynyl group, a substituted or unsubstituted cycloalkyl group, a substituted or unsubstituted aralkyl group, an alkoxyl group, or a substituted or unsubstituted amino group; m represents an integer of 1 to 3; and A is a monovalent, divalent or trivalent connecting group and represents a substituted or unsubstituted aralkyl group, a substituted or unsubstituted alkyl group, a substituted amino group, a divalent alkylidene group, a divalent aralkylidene group, or a trivalent methine group.

In the above Formula (I), the unsubstituted alkyl group represented by $R^1$ and $R^2$ may preferably include a straight-chain or branched alkyl having 1 to 18 carbon atoms, as exemplified by methyl, ethyl, propyl, i-propyl, butyl, t-butyl, i-butyl, amyl, i-amyl, sec-amyl, texyl, hexyl, heptyl, octyl, nonyl, dodecyl, and stearyl.

The substituted alkyl group represented by $R^1$ and $R^2$ may preferably include an alkoxyalkyl group having 2 to 18 carbon atoms, a halogenoalkyl group having 1 to 18 carbon atoms, a hydroxyalkyl group having 1 to 18 carbon atoms, and an aminoalkyl group having 1 to 18 carbon atoms.

For example, the alkoxylalkyl group includes methoxyethyl, ethoxymethyl, ethoxyethyl, ethoxypropyl, ethoxybutyl, propoxymethyl, propoxybutyl, i-propoxypentyl, t-butoxyethyl, and hexyloxybutyl.

The halogenoalkyl group includes, for example, chloromethyl, chloroethyl, bromoethyl, chloropropyl, chlorobutyl, chlorohexyl, and chloroxyl.

The hydroxyalkyl group includes, for example, hydroxymethyl, hydroxyethyl, hydroxypropyl, hydroxybutyl, hydroxypentyl, hydroxyhexyl, and hydroxyheptyl.

The aminoalkyl group includes, for example, aminomethyl, acetylaminomethyl, dimethylaminomethyl, aminoethyl, acetylaminoethyl, dimethylaminoethyl, diethylaminoethyl, morpholinoethyl, piperidinoethyl, diethylaminopropyl, dipropylaminoethyl, acetylaminopropyl, aminobutyl, and morpholinobutyl.

The alkenyl group represented by $R^1$ and $R^2$ includes, for example, vinyl, allyl, propenyl, butenyl, pentenyl, hexenyl, heptenyl, and octenyl.

The alkynyl group includes, for example, acetyl, propargyl, butynyl, pentynyl, hexynyl, heptynyl, and octynyl.

The cycloalkyl group includes, for example, cyclopentyl, cyclohexyl, and cycloheptyl.

The aralkyl group represented by $R^1$ and $R^2$ includes, for example, benzyl, phenethyl, and tolylmethyl.

The amino group represented by $R^1$ and $R^2$ include, for example, acetylamino, dimethylamino, diethylamino, and amino.

The alkoxyl group represented by $R^1$ and $R^2$ includes, for example, methoxy, ethoxy, and propoxy.

Of the above, the substituents preferred as $R^2$ are a chlorine atom, a bromine atom, methyl, ethyl, i-propyl, t-butyl, sec-amyl, texyl, ethoxymethyl, ethoxyethyl, chloromethyl, hydroxymethyl, aminomethyl, dimethylaminomethyl, and benzyl. The substituents preferred as $R^1$ are a chlorine atom, methyl, ethyl, i-propyl, t-butyl, amyl, texyl, hydroxyl, chloromethyl, hydroxymethyl, benzyl, and cyclohexyl.

As A, the monovalent group substituted or unsubstituted aralkyl group includes, for example, benzyl, p-methoxybenzyl, p-N,N-dimethylaminobenzyl, p-pyrrolidinobenzyl, p-methylbenzyl, p-hydroxybenzyl, p-chlorobenzyl, 3,5-dichloro-4-hydroxybenzyl, 3-methyl-5-t-butyl-4-hydroxybenzyl, o,p-dimethylbenzyl, 3,5-dimethyl-4-hydroxybenzyl, 2-hydroxy-3-t-butyl-5-methylbenzyl, and naphthylmethyl.

As the A, the monovalent group substituted or unsubstituted alkyl group includes, for example, methyl, ethyl, i-propyl, N,N-dimethylaminomethyl, N-benzylaminomethyl, methoxymethyl, ethoxymethyl, hydroxymethyl, methoxycarbonylethyl, methoxycarbonylmethyl, ethoxycarbonylethyl, and diethyl phosphonatomethyl.

The monovalent group substituted amino group includes, for example, methylamino, dimethylamino, diethylamino, acetylamino, phenylamino, diphenylamino, and triazinylamino.

The divalent group alkylidene group includes, for example, methylene, ethylidene, propylidene, and butylidene.

The divalent group aralkylidene group includes, for example, benzylidene, p-methylbenzylidene, and p-dimethylaminobenzylidene.

Of the above, preferred connecting groups as A are a monovalent aralkyl group, a divalent alkylidene group or aralkylidene group, and a trivalent methine group. Particularly preferred groups are a monovalent aralkyl group and a divalent alkylidene group or aralkylidene group.

Of the reducing agents represented by Formula (I), examples of preferred reducing agents are set out below, but are by no means limited to these.

They include 2,4-dimethyl-6-t-butylphenol, 2-methyl-4-i-propyl-6-t-butylphenol, 2,6-di-t-butyl-4-dimethylaminophenol, 2,6-di-t-butyl-4-hydroxymethylphenol, 2-t-butyl-6-benzyl-4-methylphenol, 2,6-di-t-butyl-4-o-tolylmethylphenol, 2,6-di-t-butyl-4-benzylphenol, 2-t-butyl-4-(p-methoxybenzyl)-5-methylphenol, 2,6-dimethyl-4-(α-naphthylmethyl)phenol, 2,6-di-t-butyl-4-(2-hydroxy-3-t-butyl-5-methylbenzyl)phenol, 2-t-butyl-4-(p-chlorobenzyl)-6-cyclohexylphenol, 2-t-butyl-4-(2-hydroxy-3,5-dimethylbenzyl)-5-methylphenol, 2-t-butyl-4-benzyl-6-propargylphenol, 2,6-di-t-butyl-4-(3,5-dichloro-4-hydroxybenzyl)phenol, 2,6-di-t-butyl-4-(3,5-dimethyl-4-hydroxybenzyl)phenol, 2,6-ditexyl-4-(4-hydroxybenzyl)phenol, 2-texyl-4-benzyl-5-methylphenol, 2-allyl-4-benzyl-5-methylphenol, 2-texyl-4-(p-chlorobenzyl)-5-allylphenol, 2-chloro-4-dimethylaminomethylphenol, 2,6-di-i-propyl-4-diethylaminophenol, 2-t-butyl-4-(2-hydroxy-3-t-butyl-5-methylbenzyl)phenol, 4,4'-methylenebis(2,6-di-t-butylphenol), 4,4'-methylenebis(2-t-butyl-5-methylphenol), 4,4'-methylenebis(2-t-butyl-6-methylphenol), 4,4'-methylenebis(2-texyl-6-methylphenol), 4,4'-methylenebis(2-cyclohexyl-6-methylphenol), 4,4'-methylenebis(2-cyclohexyl-6-t-butylphenol), 4,4'-ethylidenebis(2-6-di-t-butylphenol), 4,4'-ethylidenebis(2-t-butyl-6-methylphenol), 4,4'-ethylidenebis(2-cyclohexyl-6-methylphenol), 4,4'-ethylidenebis(2-texyl-6-methylphenol), 4,4'-propylidenebis(2,6-di-t-butylphenol), 4,4'-butylidenebis(2-t-butyl-6-methylphenol), 4,4'-butylidenebis(2-texyl-6-methylphenol), 4,4'-butylidenebis(2-cyclohexyl-6-methylphenol), bis(3,5-di-t-butyl-4-hydroxyphenyl)phenylmethane, bis(3,5-di-t-butyl-4-hydroxyphenyl)(4-methoxyphenyl)methane, bis(3,5-di-t-butyl-4-hydroxyphenyl)(4-dimethylaminophenyl)methane, tris(3,5-di-t-butyl-4-hydroxyphenyl)methane, and bis(3-t-butyl-4-hydroxy-5-methylphenyl)phenylmethane.

Of these, particularly preferred reducing agents are 2,6-di-t-butyl-4-o-tolylmethylphenol, 2,6-di-t-butyl-4-benzylphenol, 2,6-di-t-butyl-4-(2-hydroxy-3-t-butyl-5-methylbenzyl)phenol, 2,6-di-t-butyl-4-(3,5-dichloro-4-hydroxybenzyl)phenol, 2-t-butyl-4-(2-hydroxy-3,5-dimethylbenzyl)-5-methylphenol, 4,4'- methylenebis(2,6-di-t-butylphenol), 4,4'-methylenebis(2-t-butyl-5-methylphenol), 4,4'-methylenebis(2-t-butyl-6-methylphenol), 4,4'-ethylidenebis(2-6-di-t-butylphenol), 4,4'-ethylidenebis(2-t-butyl-6-methylphenol), 4,4'-propylidenebis(2,6-di-t-butylphenol), 4,4'-butylidenebis(2-cyclohexyl-6-methylphenol), bis(3,5-di-t-butyl-4-hydroxyphenyl)phenylmethane, bis(3,5-di-t-butyl-4-hydroxyphenyl)(4-methoxyphenyl)methane, bis(3,5-di-t-butyl-4-hydroxyphenyl)(4-dimethylaminophenyl)methane, and tris(3,5-di-t-butyl-4-hydroxyphenyl)methane.

As the reducing agent that turns into the light-absorbing compound as a result of oxidation-reduction reaction, the compound represented by the following Formula (II) can also used.

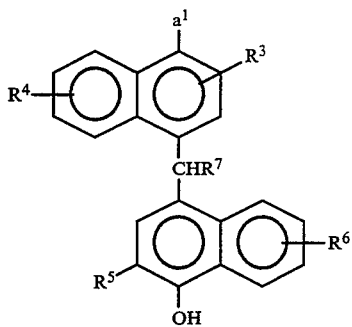

In the above Formula (II), $R^5$ represents a hydrogen atom, an alkyl group, a cycloalkyl group, or an aralkyl group; $R^3$, $R^4$ and $R^6$ each independently represent a hydrogen atom, a halogen atom, an alkyl group, an amino group, an aryl group, an aralkyl group, an alkoxyl group, a nitro group, an acyl group, or a cyano group; $R^7$ represents a hydrogen atom, a substituted or unsubstituted alkyl group, or a substituted or unsubstituted aryl group; and $a^1$ represents a hydrogen atom, a hydroxyl group, a halogen atom, a substituted or unsubstituted alkyl group, a cycloalkyl group, an alkoxyl group, or a substituted or unsubstituted amino group.

The halogen atom represented by $a^1$, $R^3$, $R^4$ and $R^6$ in the Formula (II) includes a fluorine atom, a chlorine atom, a bromine atom, and an iodine atom.

The alkyl group represented by $a^1$, $R^3$, $R^4$, $R^5$, $R^6$ and $R^7$ may preferably be a substituted or unsubstituted straight-chain or branched alkyl group having 1 to 18 carbon atoms, including, for example, straight-chain or branched hydrocarbon group such as methyl, ethyl, propyl, i-propyl, butyl, t-butyl, i-butyl, amyl, i-amyl, hexyl, texyl, heptyl, octyl, nonyl, dodecyl, or stearyl; a straight-chain or branched alkoxyalkyl group such as methoxyethyl, ethoxyethyl, ethoxypropyl, ethoxybutyl, propoxybutyl, i-propoxypentyl, t-butoxyethyl, or hexyloxybutyl; a hydroxylalkyl group such as hydroxymethyl, hydroxyethyl, hydroxypropyl, hydroxybutyl, hydroxypentyl, hydroxyhexyl, or hydroxyheptyl; an aminoalkyl or alkylaminoalkyl group such as aminomethyl, dimethylaminomethyl, aminoethyl, dimethylaminoethyl, diethylaminoethyl, morpholinoethyl, piperidinoethyl, aminopropyl, diethylaminopropyl, dipropylaminoethyl, aminobutyl, or morpholinobutyl.

The cycloalkyl group represented by $a^1$ and $R^5$ may preferably be a substituted or unsubstituted cycloalkyl group having 5 to 18 carbon atoms, including, for example, cyclopentyl, cyclohexyl, cycloheptyl, cyclooctyl, methylcyclohexyl, dimethylcyclohexyl, and ethylcyclohexyl.

The amino group represented by $a^1$, $R^3$, $R^4$ and $R^6$ may preferably be a substituted or unsubstituted amino group, including, for example, amino, acetylamino, methylamino, dimethylamino, diethylamino, pyrrolidino, morpholino, benzenesulfonamido, toluenesulfonamido, dipropylamino, and dibutylamino.

The aryl group represented by $R^3$, $R^4$, $R^6$ and $R^7$ may preferably be a substituted or unsubstituted aryl group having 6 to 16 carbon atoms, including, for example, phenyl, naphthyl, anthryl, phenanthryl, tolyl, xylyl, cumenyl, mesityl, chlorophenyl, methoxyphenyl, and fluorophenyl.

The alkoxyl group represented by $a^1$, $R^3$, $R^4$ and $R^6$ may preferably be a substituted or unsubstituted alkoxyl group having 1 to 18 carbon atoms, including, for example, methoxy, ethoxy, propoxy, i-propoxy, and butoxy.

The aralkyl group represented by $R^3$, $R^4$, $R^5$ and $R^6$ may preferably be a substituted or unsubstituted aralkyl group having 7 to 19 carbon atoms, including, for example, benzyl, phenethyl, benzhydryl, trityl, phenylpropyl, naphthylmethyl, chlorobenzyl, dichlorobenzyl, methoxybenzyl, and methylbenzyl.

The acyl group represented by $R^3$, $R^4$ and $R^6$ includes acetyl and propionyl.

Examples of the compound represented by Formula (II) having the above substituent include 4,4'-methylenebis(2-methyl-1-naphthol), 4,4'-methylenebis(2-ethyl-1-naphthol), 4,4'-methylenebis(2-t-butyl-1-naphthol), 4,4'-methylenebis(2-cyclohexyl-1-naphthol), 4,4'-methylenebis(2-t-butyl-6-methyl-1-naphthol), 4,4'-methylenebis(2,6-diethyl-1-naphthol), 4,4'-methylenebis(2-benzyl-1-naphthol), 4,4'-methylenebis(2-t-butyl-8-methyl-1-naphthol), 4,4'-methylenebis(2-methyl-5-chloro-1-naphthol), 4,4'-methylenebis(2-methyl-8-dimethylamino-1-naphthol), 4,4'-methylenebis(2-methyl-5-benzyl-1-naphthol), 4,4'-methylenebis(2-methyl-5-methoxy-1-naphthol), 4,4'-methylenebis(2-methyl-5-phenyl-1-naphthol), 4,(3'-cyclohexyl-4'-hydroxynaphthyl)methyl-2-methyl-1-naphthol, 4-(3'-t-butyl-4'-hydroxynaphthyl)methyl-2-methyl-1-naphthol, 4,(3'-cyclohexyl-4'-hydroxynaphthyl)methyl-2-t-butyl-1-naphthol, 4,4'-benzylidenebis(2-methyl-1-naphthol), 4,4'-benzylidenebis(2-t-butyl-1-naphthol), 4,4'-ethylidenebis(2-methyl-1-naphthol), 4,4'-ethylidenebis(2-t-butyl-1-naphthol), and bis(4-hydroxy-3-methylnaphthyl)tolylmethane.

As another reducing agent that turns into the light-absorbing compound as a result of oxidation-reduction reaction, the compound represented by the following Formula (III) can also used.

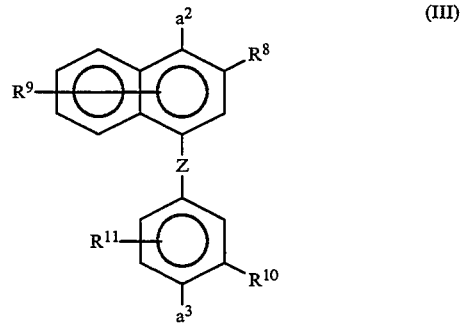

In the Formula (III), $R^8$, $R^9$, $R^{10}$ and $R^{11}$ each independently represent a hydrogen atom, a halogen atom, a substituted or unsubstituted alkyl group, a cycloalkyl group, an alkoxyl group, a substituted or unsubstituted aralkyl group, a substituted or unsubstituted aryl group, a substituted or unsubstituted amino group, a nitro group, or an acyl group; Z represents a divalent group; and $a^2$ and $a^3$ each represent a hydrogen atom, a hydroxyl group, a halogen atom, a substituted or unsubstituted alkyl group, an alkoxyl group or a substituted or unsubstituted amino group, provided that at least one of $a^2$ and $a^3$ is a hydroxyl group.

In the Formula (III), the halogen atom represented by $R^8$, $R^9$, $R^{10}$ $R^{11}$, $a^2$ and $a^3$ includes a fluorine atom, a chlorine atom, a bromine atom, and an iodine atom.

In the Formula (III), the alkyl group represented by $R^8$, $R^9$, $R^{10}$, $R^{11}$, $a^2$ and $a^3$ may preferably be a straight-chain or branched alkyl group having 1 to 18 carbon atoms, including, for example, methyl, ethyl, propyl, i-propyl, butyl, t-butyl, i-butyl, amyl, i-amyl, sec-amyl, textyl, hexyl, heptyl, octyl, nonyl, dodecyl, and stearyl. The substituted alkyl group may preferably include an alkoxyalkyl group having 2 to 18 carbon atoms, a halogenoalkyl group having 1 to 18 carbon atoms, a hydroxyalkyl group having 1 to 18 carbon atoms, and an aminoalkyl group having 1 to 18 carbon atoms, specifically including, for example, methoxyethyl, ethoxymethyl, ethoxyethyl, ethoxypropyl, ethoxybutyl, propoxybutyl, i-propoxypentyl, t-butoxyethyl, hexyloxybutyl, chloromethyl, chloroethyl, bromoethyl, chloropropyl, chlorobutyl, chlorohexyl, chlorooctyl, hydroxymethyl, hydroxyethyl, hydroxypropyl, hydroxybutyl, hydroxypentyl, hydroxyhexyl, hydroxyheptyl, aminomethyl, acetylaminomethyl, dimethylaminomethyl, aminoethyl, acetylaminoethyl, dimethylaminoethyl, diethylaminoethyl, morpholinoethyl, pyperidinoethyl, diethylaminopropyl, dipropylaminoethyl, aminopropyl, acetylaminopropyl, aminobutyl, and morpholinobutyl.

The aryl group represented by $R^8$, $R^9$, $R^{10}$ and $R^{11}$ includes, for example, phenyl, naphthyl, anthryl, and phenanthryl. The substituted aryl group includes, for example, tolyl, xylyl, cumenyl, mesityl, chlorophenyl, methoxyphenyl, and fluorophenyl.

The aralkyl group represented by $R^8$, $R^9$, $R^{10}$ and $R^{11}$ includes, for example, benzyl, phenethyl, benzhydryl, trityl, phenylpropyl, and naphthylmethyl. The substituted aralkyl group includes, for example, chlorobenzyl, dichlorobenzyl, methoxybenzyl, and methylbenzyl.

The cycloalkyl group represented by $R^8$, $R^9$, $R^{10}$, $R^{11}$, $a^2$ and $a^3$ includes for example a cycloalkyl group with a ring of 5, 6 or 7 members, which may be substituted with an alkyl group.

The alkoxyl group represented by $R^8$, $R^9$, $R^{10}$, $R^{11}$ $a^2$ and $a^3$ includes, for example, methoxy, ethoxy, propoxy, butoxy, i-propoxy, benzyloxy, and 2-phenylethoxy.

The substituted or unsubstituted amino group represented by $a^2$ and $a^3$ includes, for example, amino, acetylamino, methylamino, isopropylamino, dimethylamino, phenylamino, diethylamino, cyblopentylamino, cyclopentylmethylamino, cyclohexylamino, piperidino, and pyrrolidino.

Z represents a divalent group, and is exemplified by an alkylene group and an aralkylene group. Specifically, it preferably includes methylene, ethylene, propylidene, benzylidene, cinnamylidene, p-hydroxybenzylidene, p-methylbenzylidene, and p-dimethylaminobenzylidene.

Examples of the compound represented by Formula (III), having the above substituents, include 2-methyl-4-(3,5-dimethyl-4-hydroxyphenyl)methyl-1-naphthol, 2-methyl-4-(3,5-di-t-butyl-4-hydroxyphenyl)methyl-1-naphthol, 2-methyl-4-(4-hydroxyphenyl)methyl-1-naphthol, 2-methyl-4-p-tolylmethyl-1-naphthol, 2-methyl-4-benzyl-1-naphthol, 2-t-butyl-4-(4-hydroxyphenyl)methyl-1-naphthol, 2-methyl-4-(3,5-dichloro-4-hydroxyphenyl)methyl-1-naphthol, 2-ethyl-4-(3,5-di-t-butyl-4-hydroxyphenyl)methyl-1-naphthol, 2-methyl-4-(3,5-dimethoxy-4-hydroxyphenyl)methyl-1-naphthol, 2-methyl-4-(3-methyl-4-hydroxyphenyl)methyl-1-naphthol, 2-t-butyl-4-(3-t-butyl-4-hydroxyphenyl)methyl-1-naphthol, 2,6-di-t-butyl-4-α-naphthylmethylphenol, 2,6-di-t-butyl-4-methoxynaphthylmethylphenol, 2-methyl-4-(3-chloro-4-hydroxyphenyl)methyl-1-naphthol, 2-methyl-4-(4-dimethylaminophenyl)methyl-1-naphthol, 2-ethyl-4-diphenylmethyl-1-naphthol, 2-methyl-4-(3-cyclohexyl-4-hydroxyphenyl)-methyl-1-naphthol, 2-methyl-4-(3-phenyl-4-hydroxyphenyl)methyl-1-naphthol, 2-methyl-4-(3-t-butyl-4-hydroxy-5'-methylphenyl)methyl-1-naphthol, and 2-methyl-4-benzyl-6-methyl-1-naphthol.

Of the above reducing agents of Formulas (I), (II) and (III), two or more ones may be used in combination.

In addition to the above reducing agents, leuco compounds of coloring matters that can be reduced can be used as the reducing agent that turns into the light-absorbing compound. Preferred leuco compounds include, for example, azo dyes, azomethine dyes, triarylmethane dyes, xanthene dyes, azine dyes, indigoid dyes, formazan dyes, nitro dyes, nitroso dyes, and azoxy dyes. Particularly preferred are leuco compounds such as azomethine dyes, triarylmethane dyes, xanthene dyes, azine dyes, and indigoid dyes. To further improve the stability of these leuco compounds, these can also be used in the form in which the hydroxyl group or amino group has been acylated or sulfonylated. Preferred examples of the leuco compounds include, for example, α-benzoyl-α-(p-diethylaminoanilino)acetanilide, α-benzoyl-α-(p-diethylamino-o-methyl-anilino)aceto-o-chloroanilide, α-benzoyl-α-(p-diethylaminoanilino)aceto-o-methoxyanilide, Crystal Violet Hydrol, 9-phenyl-2,7-dichloro-3,6-dihydroxyxanthene, 9-phenyl-2,4,5,7-tetrachloro-3,6-dihydroxyxanthene, 9-phenyl-4,5-dimethyl-3,6-dihydroxyxanthene, and 9-phenyl-3-diethylamino-6-hydroxy-7-chloroxanthene.

The reducing agent participating in the case that the oxidized product produced as a result of the oxidation-reduction reaction is further reacted with a coupler to produce the light-absorbing compound, may include, for example, secondary color developing agents. Preferred secondary color developing agents includes, for example, p-aminophenols, p-phenylenediamines, and o-aminophenols.

Also usable as the secondary color developing agent are hydrazines as disclosed in Japanese Patent Application Laid-open No. 56-27132, sulfonamidophenols as disclosed in U.S. Pat. No. 4,021,240, and also a compound capable of producing an aromatic primary amine as a result of heating, as disclosed in Japanese Patent Application Laid-open No. 59-53831. Examples of the secondary color developing agent that can be preferably used include 4-amino-N,N-diethylaniline, 2-amino-5-diethylaminotoluene, 4-amino-N,N-diethyl-3-(β-hydroxyethyl)aniline, 4-amino-N,N-bis(β-hydroxyethyl)-3-methylaniline, p-aminophenol, p-amino-o- cresol, o-aminophenol, and o-amino-p-cresol. These may be used as they are, or may be used in the form of salts such as a hydrochlorate, a sulfate, a phosphate, a p-toluenesulfonate, a benzenesulfonate, and a naphthalenedisulfonate.

The coupler may preferably include α-acylacetamides, pyrazolones, phenols, and naphthols. These are described in "SHASHIN NO KAGAKU (Chemistry of Photography)", First Edition, Shashin Kogyo Shuppansha, pp.278–282, or T. H. James, "The Theory of the Photographic Process", Fourth Edition, Macmillan Publishing Co., Inc., pp.353–361. Examples of the coupler include benzoylacetanilide, benzoylaceto-o-methoxyanilide, benzoylaceto-o-chloroanilide, 1-phenyl-3-(4'-nitrobenzamido)-5-pyrazolone, 1-phenyl-3-[m-(p-t-amylphenoxy)benzamido]-5-pyrazolone, 2-chloro-1-naphthol, and 5-isopropyl-o-cresol. Indazolones or cyanoacetyls can also be used as the coupler.

A reducing agent that does not turn into the light-absorbing compound as a result of the oxidation-reduction reaction may also be contained in the image forming medium used in the present invention so long as the object of the present invention is not be hindered.

The reducing agent utilizable as the reducing agent that does not turn into the light-absorbing compound as a result of the oxidation-reduction reaction but can be contained in the image forming medium used in the present invention includes, for example, phenols, hydroquinones, catechols, p-aminophenols, 3-pyrazolidones, resorcins, pyrogallols, m-aminophenols, m-phenylenediamines, 5-pyrazolones, alkylphenols, alkoxyphenols, naphthols, aminonaphthols, naphthalenediols, alkoxynaphthols, hydrazines, hydrazones, hydroxycoumarins, hydroxycoumarans, sulfonamide phenols, aminonaphthols, asborbic acids, hydroxyindanes, and orthobisphenols. Leuco bases obtained by reduction of coloring matters can also be used as the reducing agent.

The photopolymerization initiator includes, for example, carbonyl compounds, sulfur compounds, halogen compounds, photopolymerization initiators of redox type, and peroxide initiators sensitized with a dye such as pyrylium.

Specifically, the carbonyl compounds include diketones as exemplified by benzyl, 4,4'-dimethoxybenzyl, diacetyl, and camphorquinone; benzophenones as exemplified by 4,4'-bis(diethylamino)benzophenone, and 4,4'-dimethoxybenzophenone; acetophenones as exemplified by acetophenone, 4-methoxyacetophenone; benzoin alkyl ethers; thioxanthones as exemplified by 2-chlorothioxanthone, 2,4-dichlorothioxanthone, 2,4-diethylthioxanthone, and thioxanthone-3-carboxylic acid-β-methoxy ethyl ester; chalcones having a dislkylamino group and styrylketones; and coumarins as exemplified by 3,3'-carbonylbis(7-methoxycoumarin), and 3,3'-carbonylbis(7-diethylaminocoumarin).

The sulfur compounds include, for example, dibenzothiazolyl sulfide, decylphenyl sulfide and disulfides.

The halogen compounds include, for example, carbon tetrabromide, quinolinesulfonyl chloride, and S-triazines having a trihalomethyl group.

The photopolymerization initiators of radox type include those used in combination of a trivalent iron ionic compound (as exemplified by ferric ammonium citrate) with a peroxide, and those used in combination of a photoreducing coloring matter such as riboflavin or Methylene Blue with a reducing agent such as triethanolamine or ascorbic acid.

In the photopolymerization initiator described above (including the sensitizer), two or more photopolymerization initiators can also be used in combination to obtain a more efficient photopolymerization reaction.

Such combination of the photopolymerization initiators includes a combination of chalcones having a dialkylamino group and styrylketones or coumarins, with S-triazines having a trihalomethyl group or camphorquinone.

In the image forming medium used in the present invention, preferably used are photopolymerization initiators having a photosensitive wavelength region of from 370 nm to 520 nm.

In the image forming medium used in the present invention, the photopolymerization initiator to be used is required to be appropriately selected depending on the light-absorption characteristics of the light-absorbing compound produced as a result of the oxidation-reduction reaction of the reducing agent. Examples of such combination of the reducing agent and photopolymerization initiator are set out below.

When, for example, 4,4'-propylidenebis(2,6-di-t-butylphenol), 4,4'-butylidenebis(3-methyl-6-t-butylphenol), 4,4'-methylenebis(2,6-di-t-butylphenol), 4,4'-methylenebis(2-t-butyl-6-methylphenol), 2,6-di-t-butyl-4-(3,5-dimethyl-4-hydroxyphenyl)methylphenol, 2-methyl-4-(3,5-dimethyl-4-hydroxyphenyl)methyl-1-naphthol, etc. are used as the reducing agent, preferred are photopolymerization initiators having sensitivity at 380 nm to 420 nm, as exemplified by 2-chlorothioxanthone, 2-methylthioxanthone, 2,4-dimethylthioxanthone, 2,4-diethylthioxanthone, 3,3'-carbonylbis(7-methoxycoumarin), 2,4,6-trimethylbenzoyldiphenylphosphine oxide, and benzyl.

When, for example, 2,6-di-t-butyl-4-(2-hydroxy-3-t-butyl-5-methylbenzyl)phenol, 2,6-di-t-butyl-4-benzylphenol, 2,6-di-t-butyl-4-o-trimethylphenol, etc. are used as the reducing agent, preferred are photopolymerization initiators having sensitivity at 300 nm to 380 nm, as exemplified by 1-phenyl-2-hydroxy-2-methylpropane-1-one, 1-hydroxycyclohexyl phenyl ketone, benzyl dimethyl ketal, benzophenone, and 4-benzoyl-4'-methyldiphenyl sulfide.

When, for example, bis(3,5-di-t-butyl-4-hydroxyphenyl)-(4-dimethylaminophenyl)methane, 4,4'-methylenebis(2-methyl-1-naphthol), 4,4'-methylenebis(2-ethyl-1-naphthol); 4,4'-methylenebis(2-cyclohexyl-1-naphthol), 4,4'-methylenebis(2-t-butyl-1-naphthol), etc. are used as the reducing agent, preferred are combinations of photopolymerization initiators having sensitivity at 400 nm to 520 nm, as exemplified by 3,3'-carbonylbis(7-dimethylaminocoumarin), riboflavin tetrabutylate, or merocyanine dyes, with trichloromethyl-S-triazine compounds.

As the polymerizable polymer precursor, a compound having at least one reactive vinyl group in its molecule can be utilized.

The reactive vinyl group in these compounds includes substituted or unsubstituted vinyl groups having polymerization reactivity, as exemplified by styrene vinyl groups, acrylic acid vinyl groups, methacrylic acid vinyl groups, allyl vinyl groups, and vinyl ethers, as well as ester vinyl groups such as vinyl acetate.

Examples of the polymerizable polymer precursor satisfying such conditions are as follows.

They include, for example;
monovalent monomers such as styrene, methylstyrene, chlorostyrene, bromostyrene, methoxystyrene, dimethylaminostyrene, cyanostyrene, nitrostyrene, hydroxystyrene, aminostyrene, carboxystyrene, acrylic acid, methyl acrylate, ethyl acrylate, cyclohexyl acrylate, acrylamide, methacrylic acid, methyl methacrylate, ethyl methacrylate, propyl methacrylate, butyl methacrylate, phenyl methacrylate, cyclohexyl methacrylate, vinyl pyridine, N-vinylpyrrolidone, N-vinylimidazole, 2-vinylimidazole, N-methyl-2-vinylimidazole, propyl vinyl ether, butyl vinyl ether, isobutyl vinyl ether, β-chloroethyl vinyl ether, phenyl vinyl ether, p-methylphenyl vinyl ether, and p-chlorophenyl vinyl ether;

divalent monomers such as divinylbenzene, distyryl oxalate, distyryl malonate, distyryl succinate, distyryl glutarate, distyryl adipate, distyryl maleate, distyryl fumarate, distyryl β,β'-dimethylglutarate, distyryl 2-bromoglutarate, distyryl α,α'-dichloroglutarate, distyryl terephthalate, oxalic acid di(ethyl acrylate), oxalic acid di(methyl acrylate), malonic acid di(ethyl acrylate), malonic acid di(methyl ethyl acrylate), succinic acid di(ethyl acrylate), glutaric acid di(ethyl acrylate), adipic acid di(ethyl acrylate), maleic acid di(ethyl acrylate), fumaric acid di(ethyl acrylate), β,β'-dimethylglutaric acid di(ethyl acrylate), ethylenediacrylamide, propylenediacrylamide, 1,4-phenylenediacrylamide, 1,4-phenylenebis(oxyethyl acrylate), 1,4-phenylenebis(oxyethyl methyl acrylate), 1,4-bis(acryloyloxyethoxy)cyclohexane, 1,4-bis(acryloyloxymethylethoxy)cyclohexane, 1,4-bis(acryloyloxyethoxycarbamoyl)benzene, 1,4-bis(acryloyloxymethylethoxycarbamoyl)benzene, 1,4-bis(acryloyloxyethoxycarbamoyl)cyclohexane, bis(acryloyloxyethoxycarbamoylcyclohexyl)methane, oxalic acid di(ethyl methacrylate), oxalic acid di(methyl ethyl methacrylate), malonic acid di(ethyl methacrylate), malonic acid di(methyl ethyl methacrylate), succinic acid di(ethyl methacrylate), succinic acid di(methyl ethyl methacrylate), glutaric acid di(ethyl methacrylate), adipic acid di(ethyl methacrylate), maleic acid di(ethyl methacrylate), fumaric acid di(ethyl methacrylate), fumaric acid di(methyl ethyl methacrylate), β,β'-dimethylglutaric acid di(ethyl methacrylate), 1,4-phenylenebis(oxyethyl methacrylate), and 1.4-bis(methacryloyloxyethoxy) cyclohexane acryloyloxyethoxyethyl vinyl ether;

trivalent monomers such as pentaerythritol triacrylate, pentaerythritol trimethacrylate, pentaerythritol tri(hydroxystyrene), dipentaerythritol hexaacrylate, cyanuric acid triacrylate, cyanuric acid trimethacrylate, 1,1,1-trimethylolpropane triacrylate, 1,1,1-trimethylolpropane trimethacrylate, cyanuric acid tri(ethyl acrylate), 1,1,1-trimethylolpropane tri(ethyl acrylate), cyanuric acid tri(ethyl vinyl ether), a condensate of a reaction product between 1,1,1-trimethylolpropane and three-fold moles of toluenediisocyanate, with hydroxyethyl acrylate, and a condensate of a reaction product between 1,1,1-trimethylolpropane and three-fold moles of hexanediisocyanate, with p-hydroxystyrene; and tetravalent monomers such as ethylenetetraacrylamide, and propylenetetraacrylamide.

Two or more of these polymerizable polymer precursors may be used in combination as previously mentioned.

For the purpose of improving film formation properties and dispersion, the image forming layer may preferably be incorporated with a suitable binder.

The binder includes, for example;

cellulose esters such as nitrocellulose, cellulose phosphate, cellulose sulfate, cellulose acetate, cellulose propionate, cellulose butyrate, cellulose myristate, cellulose palmirate, cellulose acetate.propionate, and cellulose acetate.butyrate;

cellulose ethers such as methyl cellulose, ethyl cellulose, propyl cellulose, and butyl cellulose;

vinyl resins such as polystyrene, polyvinyl chloride, polyvinyl acetate, polyvinyl butyral, polyvinyl acetal, polyvinyl alcohol, and polyvinyl pyrrolidone;

copolymer resins such as a styrene/butadiene copolymer, a styrene/acrylonitrile copolymer, a styrene/butadiene/acrylonitrile copolymer, and a vinyl chloride/vinyl acetate copolymer;

acrylic resins such as polymethyl methacrylate, polymethyl acrylate, polybutyl acrylate, polyacrylic acid, polymethacrylic acid, polyacrylamide, and polyacrylonitrile;

polyesters such as polyethylene terephthalate;

polyacrylate resins such as poly(4,4'-isopropylidenediphenylene-co-1,4-cyclohexylenedimethylene carbonate), poly(ethylenedioxy-3,3'-phenylene thiocarbonate), poly(4,4'-isopropylidenediphenylene carbonate-coterephthalate), poly(4,4'-isopropylidenediphenylene carbonate), poly(4,4'-sec-butylidenediphenylene carbonate), and poly(4,4'-isopropylidenediphenylene carbonate-block-oxyethylene);

polyamides; polyimides; epoxy resins; phenol resins;

polyolefins such as polyethylene, polypropylene, and chlorinated polyethylene; and natural polymers such as gelatin.

In addition to these, toning agents, antifoggants, alkali generating agents, automatic oxidants, etc. may be optionally added in the image forming medium used in the present invention.

The heat-diffusible coloring matter may include, for example, monoazo dyes, thiazole dyes, anthraquinone dyes, triacrylmethane dyes, Rhodamine dyes and naphthol dyes. The heat-diffusible coloring matter usually has a larger heat diffusibility with a decrease in its molecular weight, and also has a smaller heat diffusibility when it has more polar groups as exemplified by a carboxyl group, an amino group, a hydroxyl group, a nitro group and a sulfone group. Accordingly, a dye having the desired heat diffusibility may be appropriately selected depending on the degree of polymerization or cross-link density of the image forming medium and the heating conditions in the transfer step, on the basis of its molecular weight and polar groups.

A capsule type coloring matter powder may also be used as the heat-diffusible coloring matter. The capsule type coloring matter powder is a powder comprising a heat-diffusible coloring matter incorporated into a core of a capsule, where the heat-diffusible coloring matter begins to diffuse once the capsule is broken as a result of the application of pressure or heat. The capsule may preferably have an average particle diameter of 4 μm or less, and more preferably 3 μm or less.

In the image forming medium used in the present invention, the components described above may preferably be used in the proportion as follows:

The organic silver salt may preferably be contained in the image forming layer 1 in an amount of 0.3 g/m² to 30 g/m², more preferably 0.7 g/m² to 15 g/m², and particularly preferably 1.2 g/m² to 8 g/m²

The photosensitive silver halide may preferably be contained in an amount of 0.001 mol to 2 mols, and more preferably 0.05 mol to 0.4 mol, per mol of the organic silver salt. The reducing agent may preferably be contained in an amount of 0.05 mol to 3 mols, and more preferably 0.2 mol to 1.3 mol, per mol of the organic silver salt. The photopolymerization initiator may preferably be contained in an amount of 0.1 part by weight to 30 parts by weight, and more preferably 0.5 part by weight to 10 parts by weight, based on 100 parts by weight of the polymerizable polymer precursor. The photopolymerization initiator may preferably be contained in an amount of 0.01 mol to 10 mols, and more preferably 0.5 mol to 3 mols, per mol of the reducing agent.

The amount of the binder optionally contained in the image forming layer 1 may preferably be in a proportion of 0 part by weight to 10 parts by weight, and more preferably 0.5 part by weight to 5 parts by weight, based on 1 part by weight of the organic silver salt. This proportion also applies in respect of the photosensitive layer 11. The amount of the binder also optionally contained in the polymerizing layer 12 may preferably be in a proportion of 0 part by weight to 10 parts by weight based on 1 part by weight of the polymerizable polymer precursor.

The components and the proportions of the components that constitute the photosensitive layer 11 and polymerizing layer 12 as shown in FIG. 2A can be considered to be the same as the instance in which the image forming layer is comprised of a single layer.

The heat-diffusible coloring matter contained in the image forming layer 1 may preferably be in an amount of 5 parts by weight to 200 parts by weight, and more preferably 10 parts by weight to 100 parts by weight, based on 100 parts by weight of the total weight of the silver halide, the organic silver salt, the reducing agent, the polymerizable polymer precursor, the photopolymerization initiator and the binder optionally contained.

In the case when the heat-diffusible coloring matter is incorporated into the polymerizing layer 12, it is suitable for the heat-diffusible coloring matter to be contained in an amount of about 5% by weight to about 60% by weight based on the polymerizing layer 12.

The image forming medium used in the present invention can be formed by dissolving the above components in a solvent together with the binder optionally used, and coating the resulting solution on the protective layer 2 or substrate 3, followed by drying.

The image forming layer 1 may preferably have a thickness of 0.1 μm to 2 mm, and more preferably 1 μm to 0.1 mm. The protective layer 2 and substrate 3 may also each preferably have a thickness of about 2 μm to about 3 mm.

The photosensitive layer 11 and the polymerizing layer 12 may each preferably have a thickness of 0.05 μm to 1 mm, more preferably 0.3 μm to 30 μm, and particularly preferably 0.6 μm to 10 μm.

As having been described above, according to the image forming method of the present invention, no heat-diffusible coloring matter is present at non-image areas because of the peeling-apart when the heat-diffusible coloring matter is transferred to the image receiving medium. Hence, any unnecessary coloring matters are not transferred to the image receiving medium.

The present invention will be described below in greater detail by giving Examples. In the following Examples, the "part(s) by weight" is simply referred to as "part(s)".

EXAMPLE 1

An image forming medium was prepared in the following way:

In a mixed solvent of 29 parts of toluene and 26 parts of n-butanol, 2 parts of behenic acid was dissolved, followed by addition of 4 parts of silver behenate to carry out emulsification. Thereafter, to the resulting emulsion solution, 0.6 part of silver bromide, 0.8 part of benzoxazinedione, 1.1 parts of 4-methoxynaphthol and 4 parts of polybutyl methacrylate were added, and 0.9 part of Michler's ketone, 0.8 part of ethyl p-dimethylaminobenzoate, 8 parts of dipentaerythritol hexaacrylate and 4 parts of chlorinated rubber were further added. The solution thus obtained was divided into three equal portions, to which coloring matters, 2.6 parts of MS-Yellow-VP, 2.2 parts of MS-Magenta-VP and 2.5 parts of MS-Cyan-VP, respectively, were added to give the respectively corresponding yellow, magenta and cyan coating solutions.

A PET film (a protective layer with a thickness of 10 μm) coated with polyvinyl alcohol, was coated on its polyvinyl alcohol side with the above yellow coating solution in a dried coating thickness of 7 μm to form an image forming layer. On this image forming layer, a PET Film (a substrate) with a thickness of 25 μm was laminated to give an image forming medium for yellow. Image forming mediums for magenta and cyan were also prepared in the same way.

Now, on the image forming medium for yellow, thus prepared, a desired mask for yellow-image formation was put and exposure was carried out for 10 seconds using a 100 W fluorescent lamp having an emission peak at 400 nm, with a distance of 5 cm from the medium.

Subsequently, the mask was removed from the yellow image forming medium, and the resulting medium was passed for 20 seconds through a heat developing assembly adjusted to 100° C. This image forming medium was further subjected to whole areal exposure for 30 seconds from the protective layer side using a 15 W fluorescent lamp having an emission peak at 380 nm, with a distance of 1 cm from the medium.

Thereafter, while the resulting image forming medium was passed between a pair of rollers to which heat and pressure were applied at 60° C. and 25 kg/cm², the protective layer was separated from the substrate. As a result, unpolymerized areas of the image forming layer had been adhered to the substrate as an image corresponding with the above mask for yellow-image formation.

With respect to the magenta image forming medium and cyan image forming medium also, the same procedure as in the preparation of the yellow image forming medium was repeated using a mask for magenta-image formation and a mask for cyan-image formation, respectively. As a result, unpolymerized areas of the image forming layer had been adhered to the substrate in each instance.

Next, an image receiving medium was superposed onto the cyan unpolymerized areas, which were then passed between rollers heated to 120° C., at a speed of 10 mm/sec. As a result, a good cyan image was formed on the image receiving medium. As the image receiving medium, a medium comprising a sheet of paper having thereon an image receiving layer made of polyester resin was used.

With respect to the magenta unpolymerized areas and yellow unpolymerized areas also, the same procedure as in the case of cyan-image formation was repeated to form the respective images. The magenta image and the yellow image were successively superposingly formed on the image receiving medium in which the cyan image had been formed so that they are superposed on the cyan image. Thus, a good multi-color image was formed on the image receiving medium.

EXAMPLE 2

| | |
|---|---|
| Xylene | 29 parts |
| n-Butanol | 26 parts |
| Behenic acid | 2 parts |
| Silver behenate | 5 parts |
| Silver bromide | 1 part |
| Polymethyl methacrylate | 1 part |

The above components were dispersed using a homomixer, at 5,000 rpm for 10 minutes in a dark room. Thereafter, 0.7 part of 4,4'-methylenebis(3,5-di-t-butylphenol) was added to the resulting dispersion to give solution A.

| | |
|---|---|
| Xylene | 30 parts |
| n-Butanol | 29 parts |
| Polymethyl methacrylate | 10 parts |
| Polyvinyl chloride | 10 parts |
| Unidick 16-824 (available from Dainippon Ink & Chemicals, Incorporated) | 21 parts |
| Chlorothioxanthone | 1.3 parts |
| Ethyl p-dimethylaminobenzoate | 0.6 part |
| MS-Magenta-VP (available from Mitsui Toastsu Chemicals, Inc.) | 1.5 parts |

The above components were mixed with stirring for 30 minutes to give solution B.

A PET film (a substrate) was coated with the solution B using an applicator in a dried coating thickness of 3 $\mu$m to form a polymerizing layer. This polymerizing layer was coated thereon with the solution A using an applicator in a dried coating thickness of 2 $\mu$m to form a photosensitive layer. Subsequently, the photosensitive layer was laminated thereon with the same protective layer as used in Example 1. An image forming medium was thus obtained.

A desired mask was put on the protective layer of this image forming medium, and exposure was carried out for 1 second using a 10 W fluorescent lamp having an emission peak at 400 nm, with a distance of 5 cm from the medium.

Subsequently, the mask was removed from this image forming medium, and the resulting medium was passed through a heat developing assembly adjusted to 100° C. This image forming medium was further put on a hot plate heated to 60° C., and in that state subjected to whole areal exposure for 20 seconds from the protective layer side using a 15 W fluorescent lamp having an emission peak at 380 nm, with a distance of 3 cm from the medium.

Thereafter, while the resulting image forming medium was passed between a pair of rollers to which heat and pressure were applied at 60° C. and 25 kg/cm², the protective layer was separated from the substrate. As a result, unpolymerized areas (red color) of the image forming layer had been adhered to the substrate as an image corresponding with the above mask.

Next, the same image receiving medium as used in Example 1 was superposed onto the unpolymerized areas, which were then passed between rollers heated to 100° C., at a speed of 10 mm/sec. As a result, a good red image was formed on the image receiving medium.

EXAMPLE 3

An image forming medium was prepared in the same manner as in Example 2 except that 21 parts of Unidick 16-824 used therein was replaced with 21 parts of Unidick V-4205 (available from Dainippon Ink & Chemicals, Incorporated), 1.3 parts of chlorothioxanthone and 0.6 part of ethyl p-dimethylaminobenzoate were replaced with 1.5 parts of Michler's ketone, and 1.5 parts of MS-Magenta-VP was replaced with 2 parts of Kayarad Red-B (available from Nippon Kayaku Co., Ltd.).

A desired mask was put on the protective layer of this image forming medium, and exposure was carried out for 0.5 second using a 10 W fluorescent lamp having an emission peak at 390 nm, with a distance of 3 cm from the medium.

Subsequently, the mask was removed from this image forming medium, and the resulting medium was passed through a heat developing assembly adjusted to 110° C. This image forming medium was further put on a hot plate heated to 60° C., and in that state subjected to whole areal exposure for 10 seconds from the protective layer side using a 15 W fluorescent lamp having an emission peak at 350 nm, with a distance of 3 cm from the medium.

Thereafter, an image was formed in the same manner as in Example 2 except that the heating roller was set to have a temperature of 110° C. As a result, a good red image was formed on the image receiving medium.

EXAMPLE 4

A composition with the following components was stirred at 5,000 rpm for 10 minutes using a homomixer to give an emulsion.

| | |
|---|---|
| Silver bromide | 1 part |
| Silver behenate | 5 parts |
| 2,6-Dichloro-4-benzenesulfonamide phenol | 2 parts |
| Behenic acid | 2 parts |
| Polyvinyl butyral (degree of polymerization: 2,200) | 10 parts |
| Isopropanol | 40 parts |
| Methyl ethyl ketone | 40 parts |

Next, the same protective layer as in Example 1 was coated thereon with this emulsion using an applicator in a dried coating thickness of 4 $\mu$m to form a photosensitive layer.

Next, a composition with the following components was thoroughly stirred and uniformly dissolved to give a coating solution.

| | |
|---|---|
| Methyl methacrylate/butyl methacrylate copolymer | 60 parts |
| Epoxy acrylate (bifunctional) | 40 parts |
| Dibenzyl | 1.2 parts |
| p-Dimentylaminobenzoic acid | 0.6 part |
| MS-Cyan-VP (available from Mitsu Toatsu Co., Ltd.) | 12 parts |

| | |
|---|---|
| -continued | |
| Methyl ethyl ketone | 400 parts |

The above photosensitive layer was coated thereon with this coating solution using an applicator in a dried coating thickness of 2 μm to form a polymerizing layer. An image forming medium was thus prepared.

A mask was put on the protective layer of this image forming medium, and exposure was carried out for 1 second using a 5 W fluorescent lamp having an emission peak at 390 nm, with a distance of 5 cm from the medium.

Subsequently, the mask was removed from this image forming medium, and the resulting medium was passed through a heat developing assembly adjusted to 95° C. Then, a PET film (a substrate) was put on the polymerizing layer of this image forming medium, and the medium was subjected to whole areal exposure for 30 seconds from the protective layer side using a 15 W fluorescent lamp having an emission peak at 350 nm, with a distance of 1 cm from the medium. Next, the protective layer was separated from the substrate. As a result, unpolymerized areas (blue color) of the image forming layer had been adhered to the substrate as an image corresponding with the above mask.

Subsequently, the same image receiving medium as used in Example 1 was superposed onto the unpolymerized areas to carry out heat transfer in the same manner as in Example 2. As a result, a good blue image was formed on the image receiving medium.

EXAMPLE 5

Using the apparatus as shown in FIG. 6, a multi-color image was formed on the same image receiving medium as used in Example 1.

First, an image forming medium was prepared in the following way:

In a mixed solvent of 29 parts of toluene and 26 parts of n-butanol, 2 parts of behenic acid was dissolved, followed by addition of 4 parts of silver behenate to carry out emulsification. Thereafter, to the resulting emulsion solution, 0.6 part of silver bromide, 0.8 part of benzoxazinedione, 1.1 parts of 4-methoxynaphthol and 4 parts of polybutyl methacrylate were added, and 0.9 part of Michler's ketone, 0.8 part of ethyl p-dimethylaminobenzoate, 8 parts of dipentaerythritol hexaacrylate and 4 parts of chlorinated rubber were further added. The solution thus obtained was divided into three equal portions, to each portion of which 1.2 parts of a capsule type coloring matter powder as prepared in the manner given below was added and 0.005 part of N,N'-diethylthiotricarbocyanine iodide was further added as a sensitizing dye. Thus three kinds of coating solutions for yellow, magenta and cyan were prepared.

The capsule type coloring matter powder for each color was prepared in the following way:

Each coloring matter was dissolved in methyl ethyl ketone (in such a proportion that the coloring matter was 15 parts based on 100 parts of the solvent), followed by addition of polymethyl methacrylate. To the resulting solution, tolylenediisocyanate was added as a capsule wall material. This organic solution was added to a 0.3% by weight aqueous solution of polyvinyl alcohol (in such a proportion that the polyvinyl alcohol solution was 200 parts based on 100 parts of the organic solution) to carry out emulsification. The dispersion thus formed was stirred at a temperature of 60° C. for 6 hours to effect hardening. After the hardening, mesh treatment was carried out followed by drying to produce a capsule powder of the heat-diffusible coloring matter with an average particle diameter of 2.0 μm.

The same protective layer as in Example 1 was coated thereon with this coating solution for each color in a dried coating thickness of 7 μm to form an image forming layer. Thus three kinds of image forming mediums for yellow, magenta and cyan were obtained.

As an image receiving medium, the same one as used in Example 1 was used. The three kinds of image forming mediums and the image receiving medium were each cut into A4 size, and put into the cartridges 14 and 13, respectively. The above three kinds of image forming mediums were so put into the cartridge 14 as to be fed therefrom in the order of cyan, magenta and yellow.

Thus, upon the switching-on of a power source, the image receiving medium was fed from the cartridge 13 through the feed rollers 15 and 16 in the feed zone, and chucked to the clip 19 on the support member 50 having a diameter of 150 mm. When the image receiving medium approached to the cartridge 14 as the support member 50 was rotated (peripheral speed: 10 mm/sec), the cyan image forming medium was fed from the cartridge 14 through the rollers 17 and 18 and superposed on the image receiving medium.

At the imagewise exposure zone, the image forming medium on the image receiving medium was imagewise exposed through the exposure means 20 (a semiconductor laser with a wavelength of 780 nm and an output of 20 mW), operating according to image signals for a cyan image. Thereafter, it was delivered further to the heat development zone as the support member 50 was rotated.

At the heat development zone, the image forming medium on the image receiving medium was heated with the heating rollers 23 and 24 and the belt 25. Temperature of the heating rollers 23 and 24 and the belt 25 was 100° C. The length of the contact part through which the belt 25 came into contact with the support member 50 was 150 mm.

Next, the image receiving medium and the image forming medium were delivered to the polymerization exposure zone, and subjected to polymerization exposure through the exposure means 28 (five ultraviolet fluorescent lamps each having an emission peak of 380 nm, a power consumption of 15 W, a diameter of 15 mm and a length of 330 mm). The distance from the periphery of the support member 50 to the tube surfaces of the fluorescent lamps was 10

Subsequently, the protective layer was removed from the image forming medium by means of the roller 51 and blade 52, so that the polymerized areas remained on the protective layer and the unpolymerized areas corresponding with the imagewise exposure pattern was formed on the image receiving medium. Thereafter, the image receiving medium was delivered to the transfer zone.

At the transfer zone, a PET film coated with an adhesive was used as the protective sheet 33. This PET film was laminated on the unpolymerized areas, which were then heated by means of the heating roller 31. As a result, a cyan image was formed on the image receiving medium. The heating using the heating roller 31 was at a temperature of 120° C., and the pressure applied was 25 kg/cm$^2$.

The unpolymerized areas on the image receiving medium were adhered to the protective sheet 33 as a result of the heating, peeled from the image receiving medium, and then wound up on the roller 30 together with the protective sheet 33.

The image receiving medium on which the cyan image had been formed was delivered to the feed zone again.

A magenta image and a yellow image were also successively formed on the image receiving medium following the same procedure as the cyan image. Thus a multi-color image comprised of the yellow image, magenta image and cyan image superposed on the same image receiving medium was finally formed.

The multi-color image thus formed was doubling-free and sharp.

EXAMPLE 6

An image forming medium comprised of image forming layers of multi-layer structure was prepared in the following way:

First, 2.0 parts of behenic acid, 0.2 part of azelaic acid, 4.0 parts of silver behenate, 9 parts of polyvinyl butyral resin, 0.7 part of silver bromide, 3.2 parts of 2,6-di-t-butyl-4-(3,5-dimethyl-4-hydroxybenzyl)phenol, 1 part of phthaladinone, 0.005 part of N,N'-diethyl-6,6'-dimethyl-thiotricarbocyanine iodide as a sensitizing dye and 55 parts of a xylene/n-butanol mixed solvent were mixed to give solution C.

A PET film (a protective layer) was coated thereon with this solution C in a dried coating thickness of 5 μm to form a photosensitive layer.

This photosensitive layer was coated thereon with polyvinyl alcohol containing colloidal silica, in a dried coating thickness of 2 μm to form an intermediate layer.

Next, 5 parts of polymethyl methacrylate, 2 parts of trimethylolpropane triacrylate, 3.5 parts of dipentaerythritol hexaacrylate, 1.2 parts of 2,4-diethylthioxanthone, 1.0 part of ethyl p-dimethylaminobenzoate and 1.2 parts of the same capsule type coloring matter powder as used in Example 5 were mixed to give solution D. The intermediate layer was coated thereon with this solution D in a dried coating thickness of 5 μm to form a polymerizing layer. In this way, in respect of coloring matter powders for cyan, magenta and yellow, the respectively corresponding image forming mediums were prepared.

Using the three kinds of image forming mediums thus obtained and the same image receiving medium as used in Example 1, images were formed in the same manner as in Example 5. As a result, a doubling-free and sharp multi-color image was formed.

We claim:

1. A method of forming an image comprising in sequence the steps of:
    (a) securing an image receiving medium to a support member;
    (b) superposing onto said image receiving medium an image forming medium containing at least a heat-diffusible coloring matter, a polymerizable polymer precursor, a photopolymerization initiator, a photosensitive silver halide, an organic silver salt and a reducing agent for forming a light absorbing compound after (i) an oxidation-reduction reaction or (ii) upon reaction with a coupler after said oxidation-reduction reaction;
    (c) subjecting said image forming medium to imagewise exposure;
    (d) heating said image forming medium;
    (e) subjecting said image forming medium to polymerization exposure to form a polymerized area and an unpolymerized area in the image forming medium;
    (f) separating said polymerized area from said unpolymerized area to such that said unpolymerized area is arranged on said image receiving medium;
    (g) transferring said heat-diffusible coloring matter in said unpolymerized area to said image receiving medium; and
    (h) removing said unpolymerized area from said image receiving medium.

2. The method according to claim 1, wherein the heat-diffusible coloring matter, the polymerizable polymer precursor, the photopolymerization initiator, the photosensitive silver halide, the organic silver salt and the reducing agent are contained in a single layer.

3. The method according to claim 1, wherein said steps (a) to (e) are repeated.

4. The method according to claim 1, wherein said support member is cylindrical, and said image receiving medium is secured to the periphery of said cylindrical support member.

5. The method according to claim 1, wherein said image forming medium comprises a photosensitive layer and a polymerizing layer, said photosensitive layer containing said photosensitive silver halide, said organic silver salt and said reducing agent for forming a light absorbing compound after (i) an oxidation-reduction reaction or (ii) upon reaction with a coupler after said oxidation-reduction reaction, and said polymerizing layer containing said heat-diffusible coloring matter, said polymerizable precursor and said photopolymerization initiator.

* * * * *

UNITED STATES PATENT AND TRADEMARK OFFICE
CERTIFICATE OF CORRECTION

PATENT NO. : 5,393,638

DATED : February 28, 1995

INVENTOR : AKIHIRO MOURI, ET AL.

It is certified that errors appear in the above-identified patent and that said Letters Patent is hereby corrected as shown below:

COLUMN 9

Line 11, "fist" should read --first--.

COLUMN 12

Line 68, "react" should read --react with--.

COLUMN 14

Line 9, "Stearic" should read --stearic--.

COLUMN 17

Line 16, "also" should read --also be--; and

Line 33, "$R^6$each" should read --$R^6$ each--.

COLUMN 18

Line 53, "also" should read --also be--.

COLUMN 19

Line 49, "$R^{10}$," should read --$R^{10}$,--; and

Line 50, "includes. for example" should read --includes, for example,--.

COLUMN 21

Line 34, "hydroxycoumarans," should read --hydroxycoumarins,-- and

UNITED STATES PATENT AND TRADEMARK OFFICE
CERTIFICATE OF CORRECTION

PATENT NO. : 5,393,638

DATED : February 28, 1995

INVENTOR : AKIHIRO MOURI, ET AL.

It is certified that errors appear in the above-identified patent and that said Letters Patent is hereby corrected as shown below:

COLUMN 21,

Line 52, "dislkylamino" should read --dialkylamino--.

COLUMN 22

Line 47, "-naphthol);" should read -- -naphthol),--; and

Line 53, "tetrabutylate," should read --tetrabutyrate,--.

COLUMN 24

Line 4, "example;" should read --example,--.

COLUMN 25

Line 4, "8 g/m$^2$" should read --8g/m$^2$--.

COLUMN 30

Line 50, "10" should read --10 mm.--.

COLUMN 31

Line 9, "Thus" should read --Thus,--.

UNITED STATES PATENT AND TRADEMARK OFFICE
CERTIFICATE OF CORRECTION

PATENT NO. : 5,393,638

DATED : February 28, 1995

INVENTOR : AKIHIRO MOURI, ET AL.

It is certified that errors appear in the above-identified patent and that said Letters Patent is hereby corrected as shown below:

<u>COLUMN 32</u>

Line 22, delete "to".

Signed and Sealed this

Eighteenth Day of July, 1995

Attest:

BRUCE LEHMAN

*Attesting Officer*              *Commissioner of Patents and Trademarks*